US011495677B2

(12) United States Patent
Jhan et al.

(10) Patent No.: US 11,495,677 B2
(45) Date of Patent: Nov. 8, 2022

(54) SEMICONDUCTOR DEVICES AND METHODS OF MANUFACTURING THEREOF

(71) Applicant: Taiwan Semiconductor Manufacturing Company Limited, Hsinchu (TW)

(72) Inventors: Yi-Ruei Jhan, Keelung (TW); Kuan-Ting Pan, Taipei (TW); Kuo-Cheng Chiang, Zhubei (TW); Kuan-Lun Cheng, Hsinchu (TW); Chih-Hao Wang, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 33 days.

(21) Appl. No.: 16/926,258

(22) Filed: Jul. 10, 2020

(65) Prior Publication Data

US 2022/0013653 A1 Jan. 13, 2022

(51) Int. Cl.

| | |
|---|---|
| ***H01L 29/78*** | (2006.01) |
| ***H01L 29/66*** | (2006.01) |
| ***H01L 21/8234*** | (2006.01) |
| ***H01L 27/088*** | (2006.01) |
| ***H01L 29/165*** | (2006.01) |

(52) U.S. Cl.

CPC .. *H01L 29/6681* (2013.01); *H01L 21/823418* (2013.01); *H01L 21/823431* (2013.01); *H01L 21/823437* (2013.01); *H01L 21/823481* (2013.01); *H01L 27/0886* (2013.01); *H01L 29/165* (2013.01); *H01L 29/66545* (2013.01); *H01L 29/785* (2013.01); *H01L 29/7848* (2013.01)

(58) Field of Classification Search

None

See application file for complete search history.

(56) References Cited

U.S. PATENT DOCUMENTS

2008/0116517 A1* 5/2008 Anderson ............. H01L 29/785 257/350

2009/0114955 A1* 5/2009 Stapelmann ...... H01L 29/66795 257/255

* cited by examiner

*Primary Examiner* — Joseph C. Nicely
*Assistant Examiner* — Lamont B Koo
(74) *Attorney, Agent, or Firm* — Foley & Lardner LLP

(57) ABSTRACT

A semiconductor device includes a first active fin structure and a second active fin structure extending along a first lateral direction. The semiconductor device includes a dummy fin structure, also extending along the first lateral direction, that is disposed between the first active fin structure and the second fin structure. The dummy fin structure includes a material that is configured to induce mechanical deformation of a first source/drain structure coupled to an end of the first active fin structure and a second source/drain structure coupled to an end of the second active fin structure.

20 Claims, 20 Drawing Sheets

SEMICONDUCTOR DEVICES AND METHODS OF MANUFACTURING THEREOF

BACKGROUND

This disclosure relates generally to a semiconductor device, and in some embodiments, to a gate-all-around transistor device that includes mechanically deformed source/drain structures.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
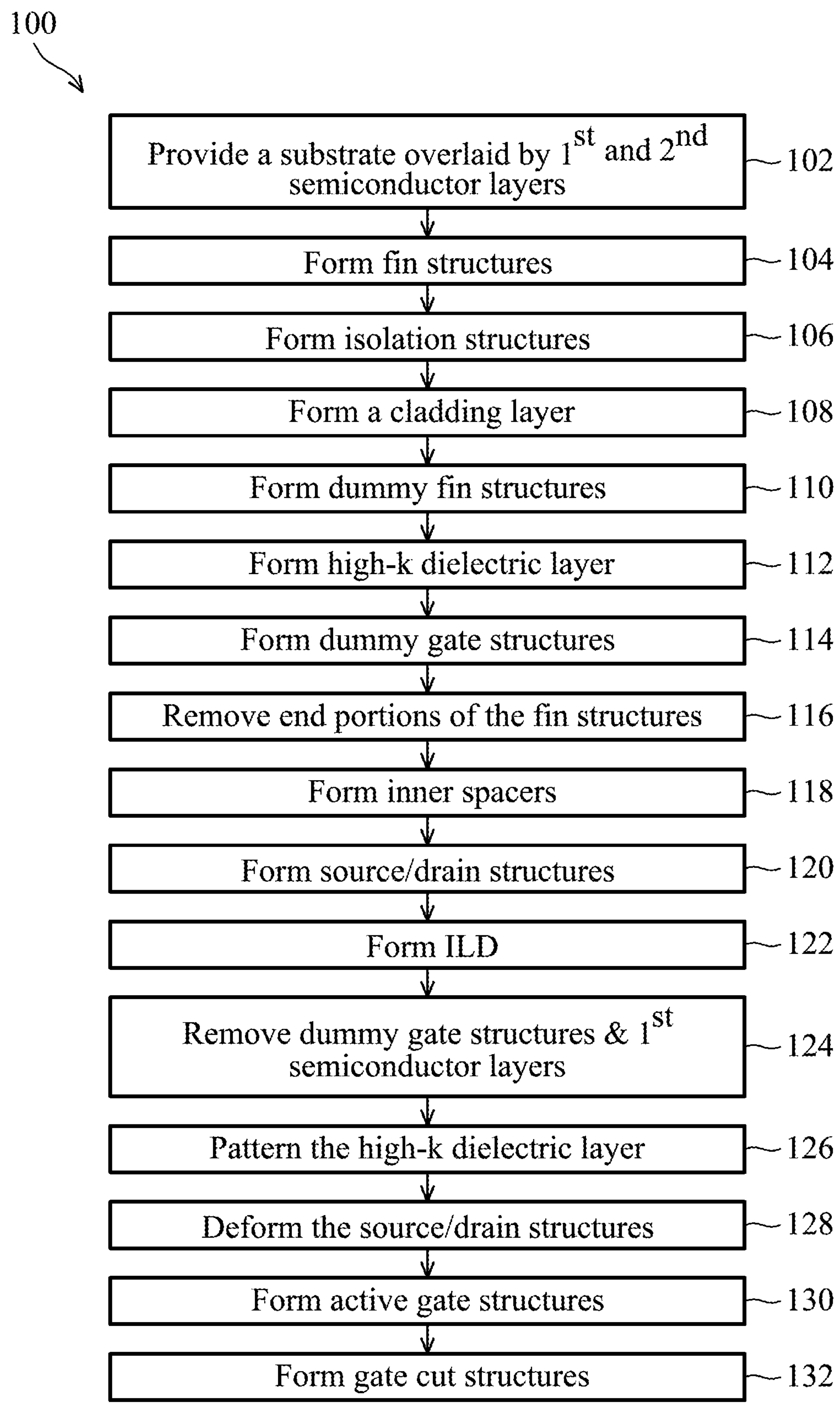
FIG. 1 illustrates a flow chart of an example method to make a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as field effect transistors are fabricated on a single wafer. Non-planar transistor device architectures, such as fin-based transistors (typically referred to as "FinFETs"), can provide increased device density and increased performance over planar transistors. Some advanced non-planar transistor device architectures, such as nanosheet (or nanowire) transistors, can further increase the performance over the FinFETs. When compared to the FinFET where the channel is partially wrapped (e.g., straddled) by a gate structure, the nanosheet transistor, in general, includes a gate structure that wraps around the full perimeter of one or more nanosheets for improved control of channel current flow. For example, in a FinFET and a nanosheet transistor with similar dimensions, the nanosheet transistor can present larger driving current ($I_{on}$), smaller subthreshold leakage current ($I_{off}$), etc. Such a transistor that has a gate structure fully wrapping around its channel is typically referred to as a gate-all-around (GAA) transistor.

The present disclosure provides various embodiments of a GAA transistor device that includes a number of GAA transistors. Each of the GAA transistors includes its respective source/drain structures that are mechanically deformed. By applying such a mechanical deformation technique on the source/drain structures, performance of the GAA transistor may be significantly improved. For example, when the GAA transistor, as disclosed herein, is configured in n-type, the source/drain structures may be mechanically stretched (e.g., applied with a tensile stress), which can enhance the electron mobility of such an n-type GAA transistor; and when the GAA transistor, as disclosed herein, is configured in p-type, the source/drain structures may be mechanically compressed (e.g., applied with a compressive stress), which can enhance the hole mobility of such a p-type GAA transistor.

FIG. 1 illustrates a flowchart of a method 100 to form a non-planar transistor device, according to one or more embodiments of the present disclosure. For example, at least some of the operations (or steps) of the method 100 can be used to form a GAA transistor device such as, for example, a nanosheet transistor device, a nanowire transistor device, a vertical transistor device, or the like. Further, the method 100 can be used to form a GAA transistor device in a respective conduction type such as, for example, an n-type GAA transistor device or a p-type GAA transistor device. The term "n-type," as used herein, may be referred to as the conduction type of a transistor having electrons as its conduction carriers; and the term "p-type," as used herein, may be referred to as the conduction type of a transistor having holes as its conduction carriers.

Figure 14:
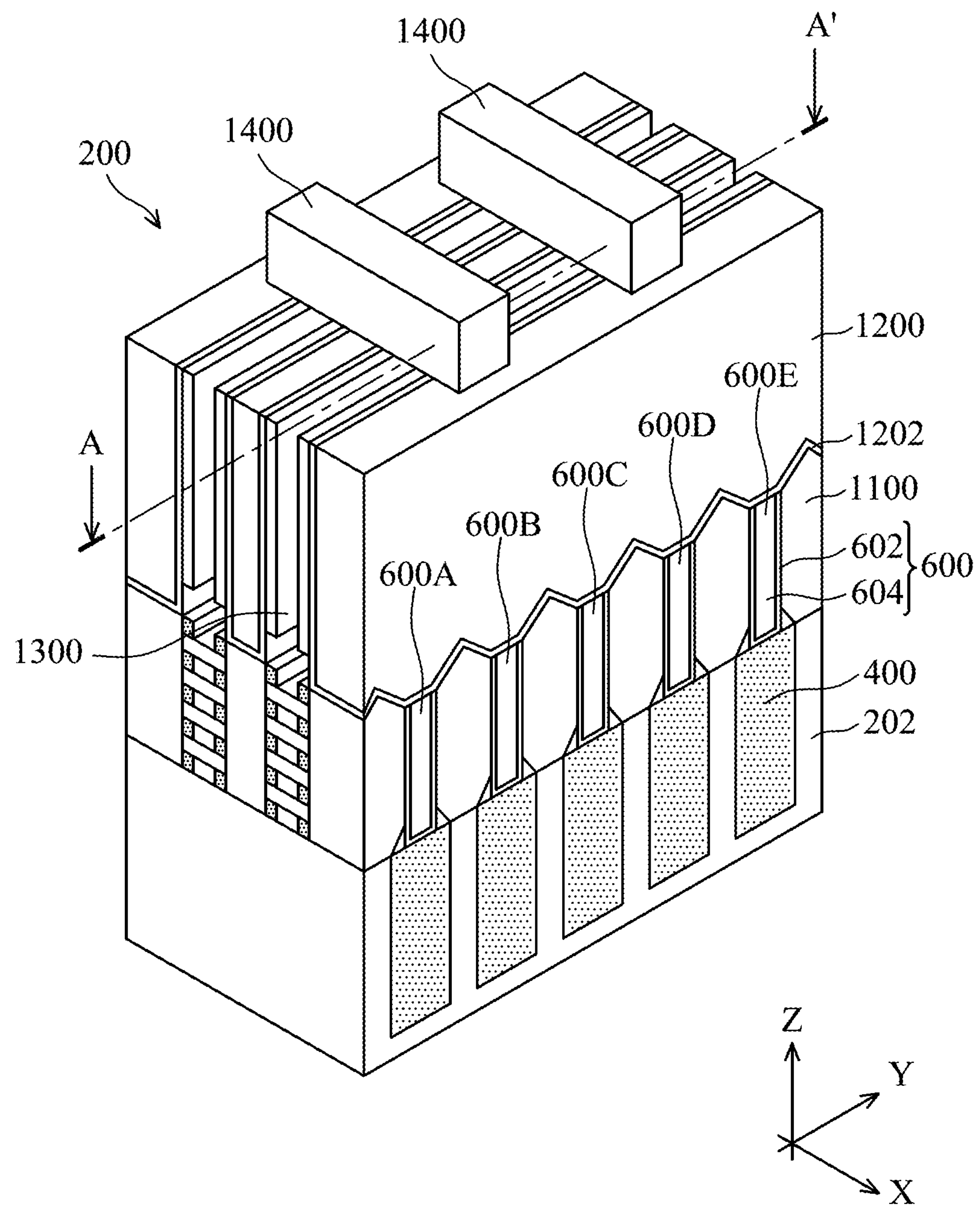
Figure 15:
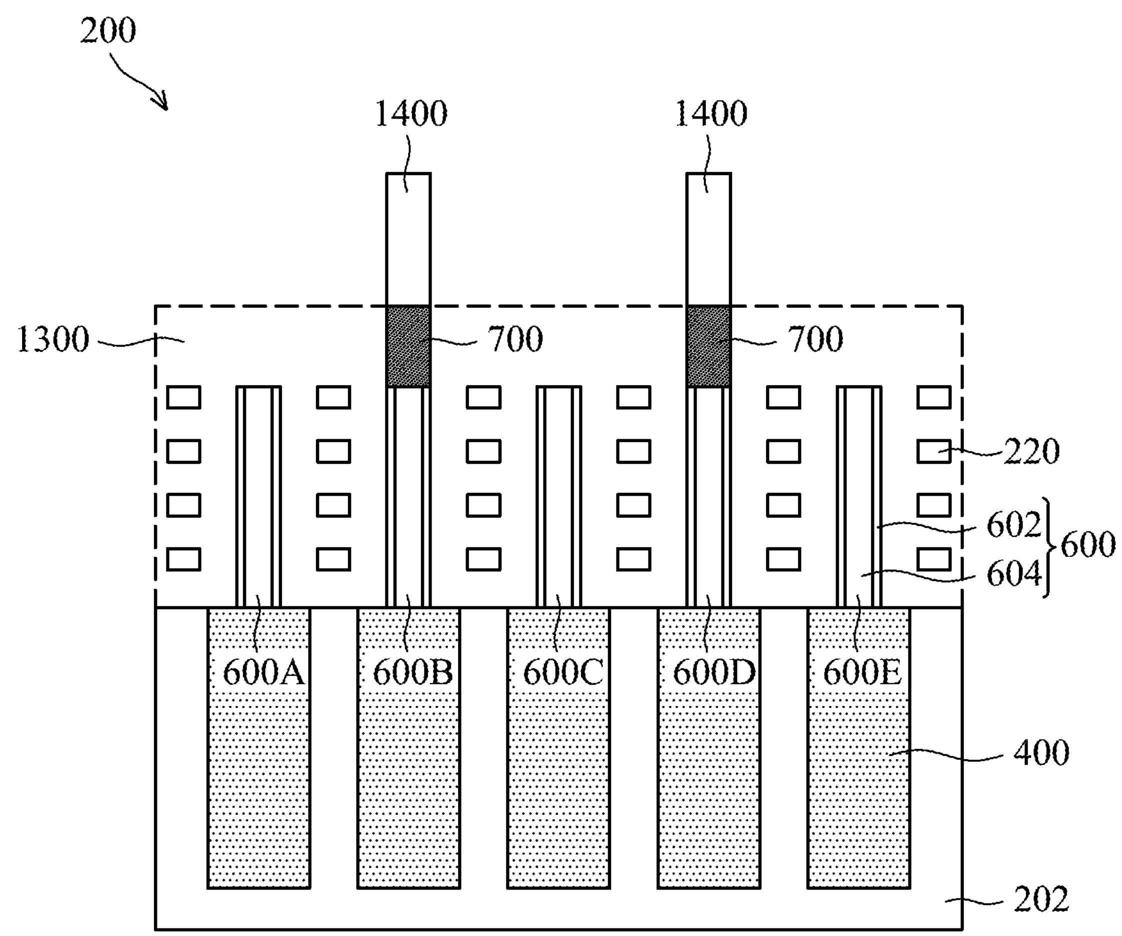
FIGS. 15, 18, and 20 provide cross-sectional views of the example GAA transistor corresponding to FIGS. 14, 17, and 19, respectively, in accordance with some embodiments.
Figure 17:
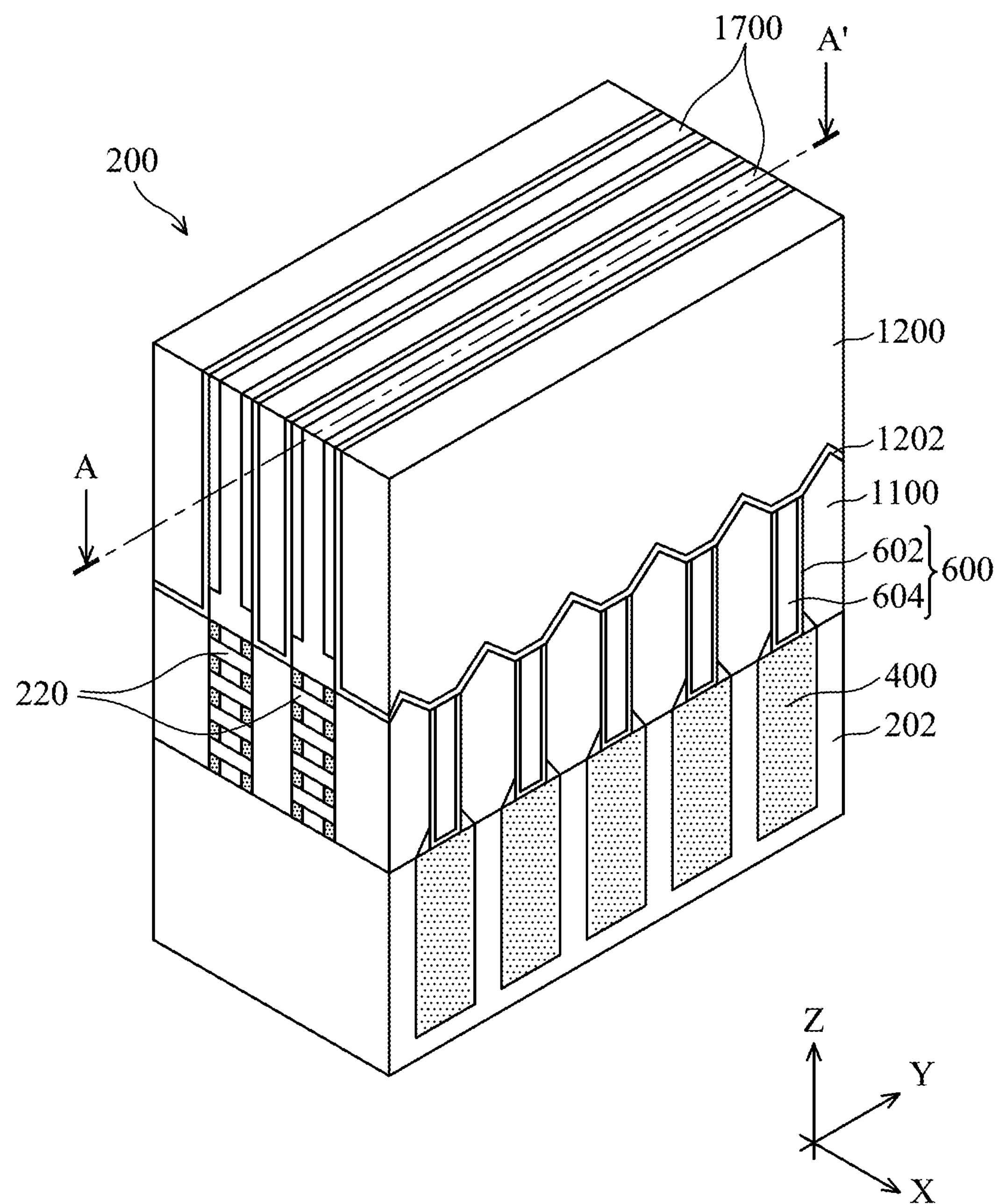
Figure 18:
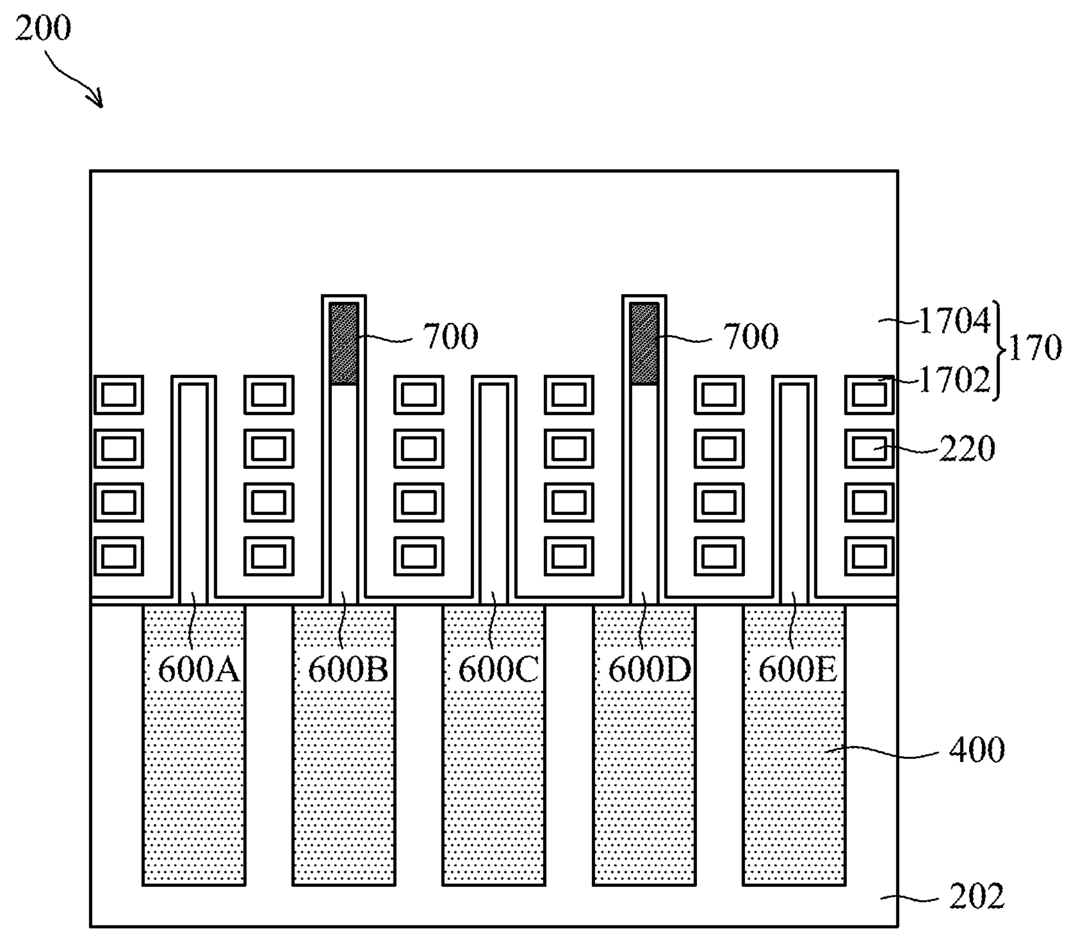
Figure 19:
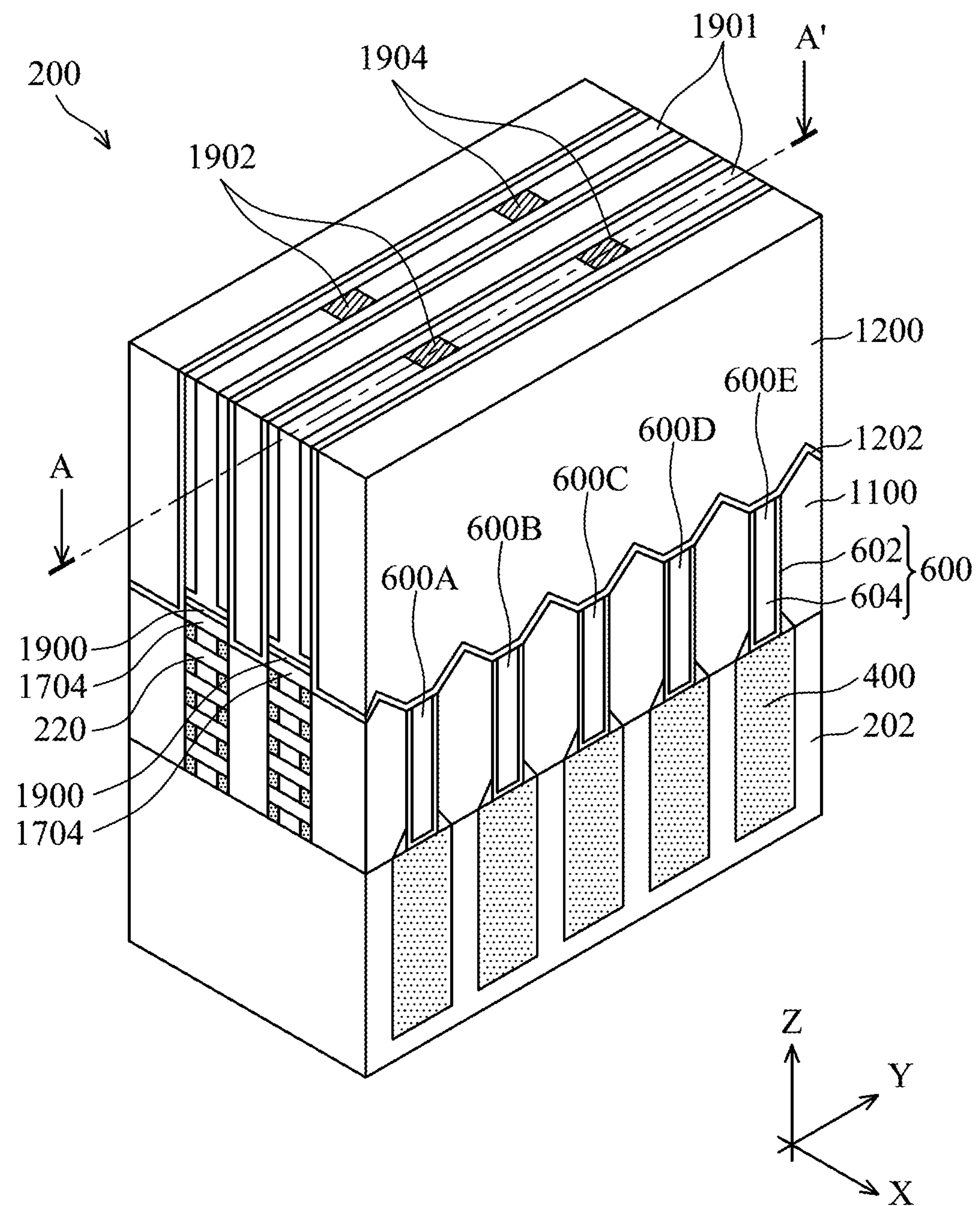
Figure 20:
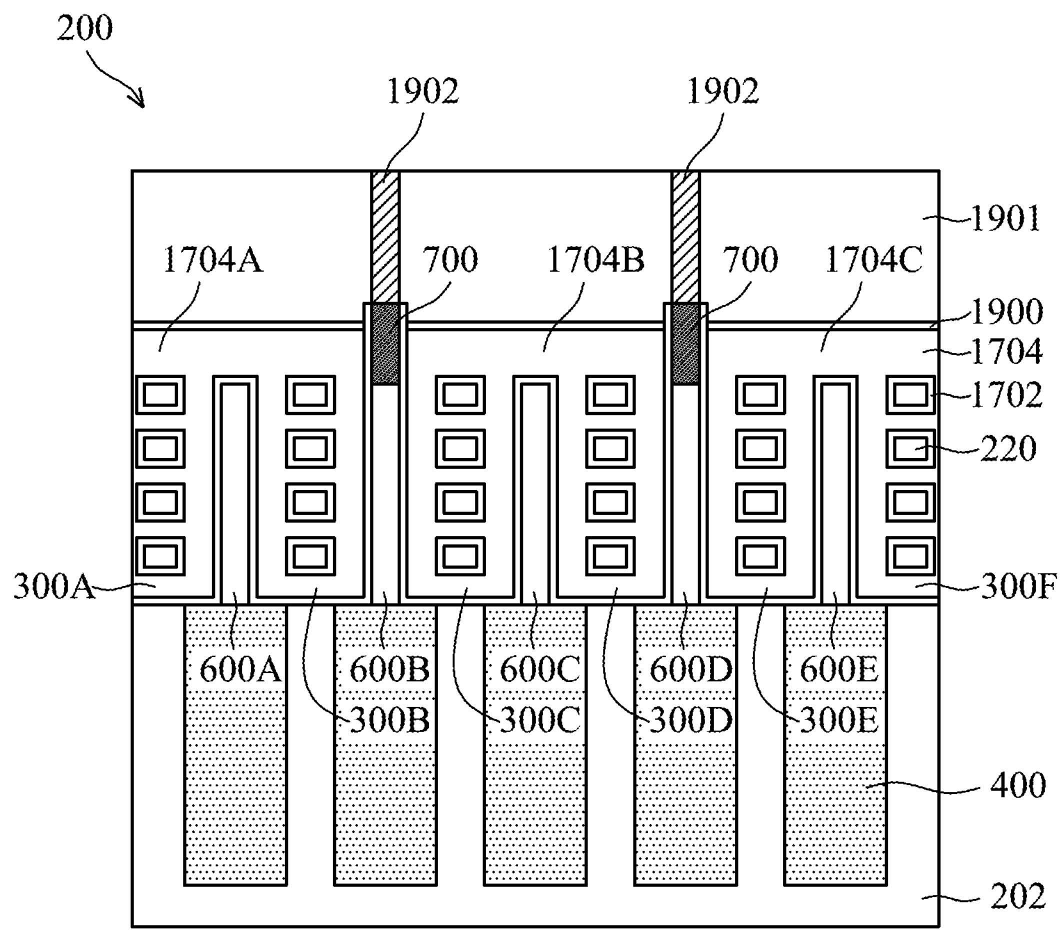

It is noted that the method 100 is merely an example, and is not intended to limit the present disclosure. Accordingly, it is understood that additional operations may be provided before, during, and after the method 100 of FIG. 1, and that some other operations may only be briefly described herein. In various embodiments, operations of the method 100 may be associated with perspective views of an example GAA transistor device at various fabrication stages as shown in FIGS. 2, 3, 4, 5, 6, 7, 8, 9, 10, 11, 12, 13, 14, 16, 17, and 19, respectively. For purposes of clarity of illustration, FIGS. 15, 18, and 20 provide cross-sectional views of the example GAA transistor corresponding to FIGS. 14, 17, and 19, respectively.

In brief overview, the method 100 starts with operation 102 of providing a substrate overlaid by a number of first semiconductor layers and a number of second semiconductor layers. Next, the method 100 proceeds to operation 104 of forming one or more fin structures. Next, the method proceeds to operation 106 of forming one or more isolation structures. Next, the method proceeds to operation 108 of forming a cladding layer. Next, the method proceeds to operation 110 of forming one or more dummy fin structures. Next, the method proceeds to operation 112 of forming a high-k dielectric layer. Next, the method proceeds to operation 114 of forming one or more dummy gate structures. Next, the method proceeds to operation 116 of removing respective end portions of each of the fin structures. Next, the method proceeds to operation 118 of forming inner spacers. Next, the method proceeds to operation 120 of forming source/drain structures. Next, the method proceeds to operation 122 of forming an inter-layer dielectric. Next, the method proceeds to operation 124 of removing the dummy gate structures and the first semiconductor layers. Next, the method proceeds to operation 126 of patterning the high-k dielectric layer. Next, the method proceeds to operation 128 of deforming the source/drain structures. Next, the method proceeds to operation 130 of forming active gate structures. Next, the method proceeds to operation 132 of forming one or more gate cut structures.

As mentioned above, FIGS. 2-20 each illustrate, in either a perspective or cross-sectional view, a portion of a GAA transistor device 200, either in n-type or p-type, at various fabrication stages of the method 100 of FIG. 1. For example, FIGS. 2-14, 16-17, and 19 illustrate perspective views of the GAA transistor device 200; and FIGS. 15, 18, and 20 illustrate cross-sectional views of the GAA transistor device 200 along cross-section A-A' (as indicated in FIGS. 14, 17, and 19, respectively), which corresponds to a cross-section cut along the longitudinal direction of a gate trench or an active gate structure. Although FIGS. 2-20 illustrate the GAA transistor device 200, it is understood the GAA transistor device 200 may include a number of other devices such as inductors, fuses, capacitors, coils, etc., which are not shown in FIGS. 2-20, for purposes of clarity of illustration.

Figure 2:
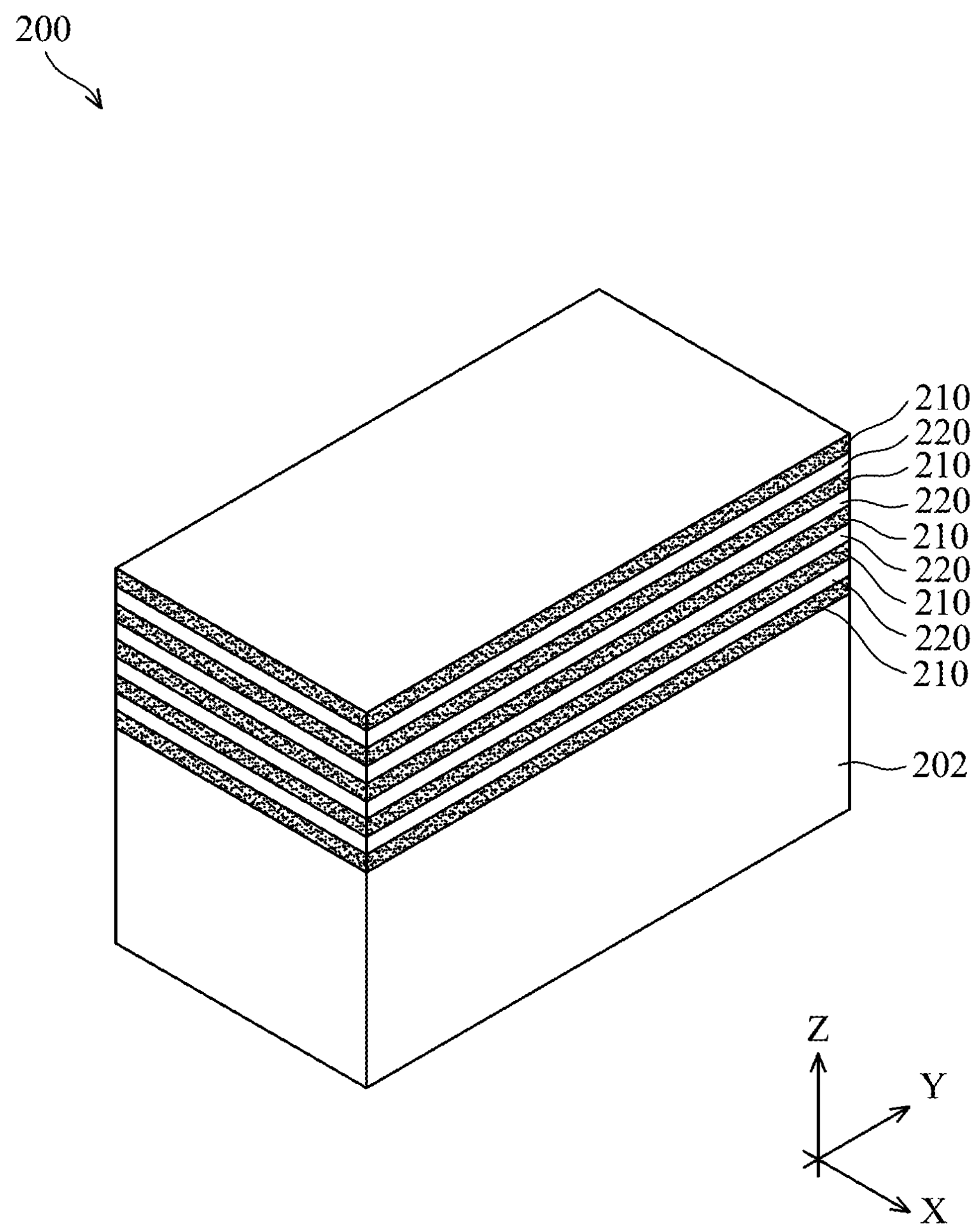
FIGS. 2, 3, 4, 5, 6, 7, 8, 9, 10, 11, 12, 13, 14, 16, 17, and 19 illustrate perspective views of the semiconductor device, made by the method of FIG. 1, at various fabrication stages, in accordance with some embodiments.

Corresponding to operation 102 of FIG. 1, FIG. 2 is a perspective view of the GAA transistor device 200 including a number of first semiconductor layers 210 and a number of second semiconductor layers 220 formed on a semiconductor substrate 202 at one of the various stages of fabrication. As shown in the illustrated example of FIG. 2, the semiconductor layers 210 and 220 are formed as a stack over the semiconductor substrate 202.

The semiconductor substrate 202 includes a semiconductor material substrate, for example, silicon. Alternatively, the semiconductor substrate 202 may include other elementary semiconductor material such as, for example, germanium. The semiconductor substrate 202 may also include a compound semiconductor such as silicon carbide, gallium arsenic, indium arsenide, and indium phosphide. The semiconductor substrate 202 may include an alloy semiconductor such as silicon germanium, silicon germanium carbide, gallium arsenic phosphide, and gallium indium phosphide. In one embodiment, the semiconductor substrate 202 includes an epitaxial layer. For example, the semiconductor substrate 202 may have an epitaxial layer overlying a bulk semiconductor. Furthermore, the semiconductor substrate 202 may include a semiconductor-on-insulator (SOI) structure. For example, the semiconductor substrate 202 may include a buried oxide (BOX) layer formed by a process such as separation by implanted oxygen (SIMOX) or other suitable technique, such as wafer bonding and grinding.

The first semiconductor layers 210 and the second semiconductor layers 220 are alternatingly disposed on top of one another (e.g., along the Z direction) to form a stack. For example, one of the second semiconductor layers 220 is disposed over one of the first semiconductor layers 210 then another one of the first semiconductor layers 210 is disposed over the second semiconductor layer 220, so on and so forth.

The stack may include any number of alternately disposed semiconductor layers 210 and 220. The semiconductor layers 210 and 220 may have different thicknesses. The first semiconductor layers 210 may have different thicknesses from one layer to another layer. The second semiconductor layers 220 may have different thicknesses from one layer to another layer. The thickness of each of the semiconductor layers 210 and 220 may range from few nanometers to few tens of nanometers. The first layer of the stack may be thicker than other semiconductor layers 210 and 220. In an embodiment, each of the first semiconductor layers 210 has a thickness ranging from about 5 nanometers (nm) to about 20 nm, and each of the second semiconductor layers 220 has a thickness ranging from about 5 nm to about 20 nm.

The two semiconductor layers 210 and 220 have different compositions. In various embodiments, the two semiconductor layers 210 and 220 have compositions that provide for different oxidation rates and/or different etch selectivity between the layers. In an embodiment, the semiconductor layers 210 include silicon germanium ($Si_{1-x}Ge_x$), and the semiconductor layers include silicon (Si). In an embodiment, each of the semiconductor layers 220 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the layers 220 (e.g., of silicon).

In various embodiments, the semiconductor layers 220 may be intentionally doped. For example, when the GAA transistor device 200 is configured in n-type (and operates in an enhancement mode), each of the semiconductor layers 220 may be silicon that is doped with a p-type dopant such as boron (B), aluminum (Al), indium (In), and gallium (Ga); and when the GAA transistor device 200 is configured in p-type (and operates in an enhancement mode), each of the semiconductor layers 220 may be silicon that is doped with an n-type dopant such as phosphorus (P), arsenic (As), antimony (Sb). In another example, when the GAA transistor device 200 is configured in n-type (and operates in a depletion mode), each of the semiconductor layers 220 may be silicon that is doped with an n-type dopant instead; and when the GAA transistor device 200 is configured in p-type (and operates in a depletion mode), each of the semiconductor layers 220 may be silicon that is doped with a p-type dopant instead. In some embodiments, each of the semiconductor layers 210 is $Si_{1-x}Ge_x$ that includes less than 50% ($x<0.5$) Ge in molar ratio. For example, Ge may comprise about 15% to 35% of the semiconductor layers 210 of $Si_{1-x}Ge_x$ in molar ratio. Furthermore, the first semiconductor layers 210 may include different compositions among them, and the second semiconductor layers 220 may include different compositions among them.

Either of the semiconductor layers 210 and 220 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 210 and 220 may be chosen based on providing differing oxidation rates and/or etch selectivity.

The semiconductor layers 210 and 220 can be epitaxially grown from the semiconductor substrate 202. For example, each of the semiconductor layers 210 and 220 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 202 extends upwardly, resulting in the semiconductor layers 210 and 220 having the same crystal orientation with the semiconductor substrate 202.

Figure 3:
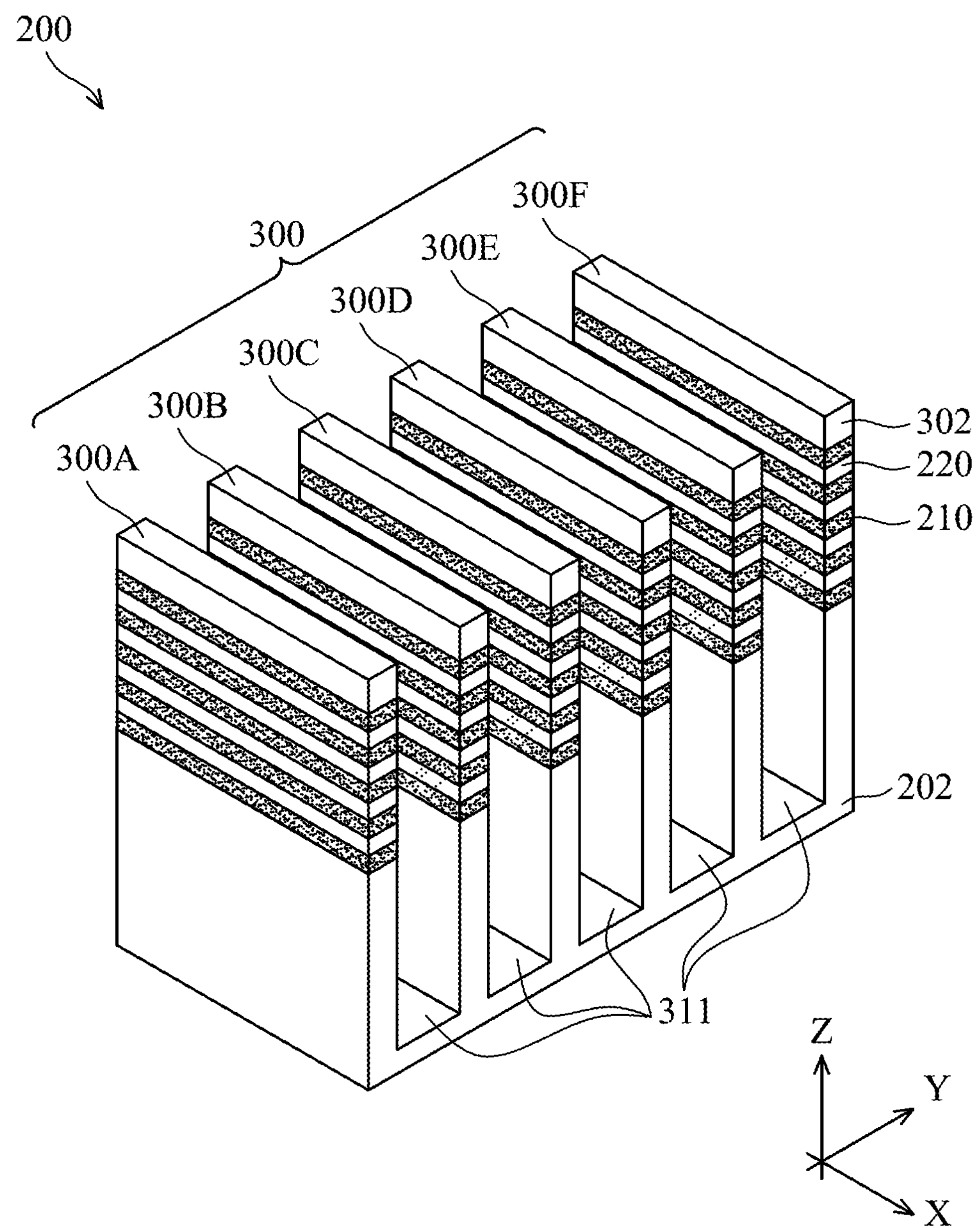

Corresponding to operation 104 of FIG. 1, FIG. 3 is a perspective view of the GAA transistor device 200 including a number of fin structures 300A, 300B, 300C, 300D, 300E, and 300F (which may sometimes be referred to as fin structures 300) at one of the various stages of fabrication. Each of the fin structures 300, which is elongated along a lateral direction (e.g., the X direction), can include a stack of semiconductor layers 210-220 interleaved with each other. Although six fin structures are shown in the illustrated embodiment of FIG. 3 (and the following figures), it should be appreciated that the GAA transistor device 200 can include any number of fin structures while remaining within the scope of the present disclosure.

The fin structures 300 are formed by patterning the semiconductor layers 210-220 and the semiconductor substrate 202 using, for example, photolithography and etching techniques. For example, a mask layer (which can include multiple layers such as, for example, a pad oxide layer and an overlying pad nitride layer) is formed over the topmost semiconductor layer 210 (FIG. 2). The pad oxide layer may be a thin film comprising silicon oxide formed, for example, using a thermal oxidation process. The pad oxide layer may act as an adhesion layer between the topmost semiconductor layer 210 (or the semiconductor layer 220 in some other embodiments) and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask 302, as illustrated in FIG. 3.

The patterned mask 302 is subsequently used to pattern exposed portions of the semiconductor layers 210-220 and the substrate 202 to form trenches (or openings) 311, thereby defining the fin structures 300 between adjacent trenches 311, as illustrated in FIG. 3. When multiple fin structures are formed, such a trench may be disposed between any adjacent ones of the fin structures. In some embodiments, the fin structures 300 are formed by etching trenches in the semiconductor layers 210-220 and substrate 202 using, for example, reactive ion etch (ME), neutral beam etch (NBE), the like, or combinations thereof. The etch may be anisotropic. In some embodiments, the trenches 311 may be strips (when viewed from the top) parallel to each other, and closely spaced with respect to each other. In some embodiments, the trenches 311 may be continuous and surround the fin structures 300.

Figure 4:
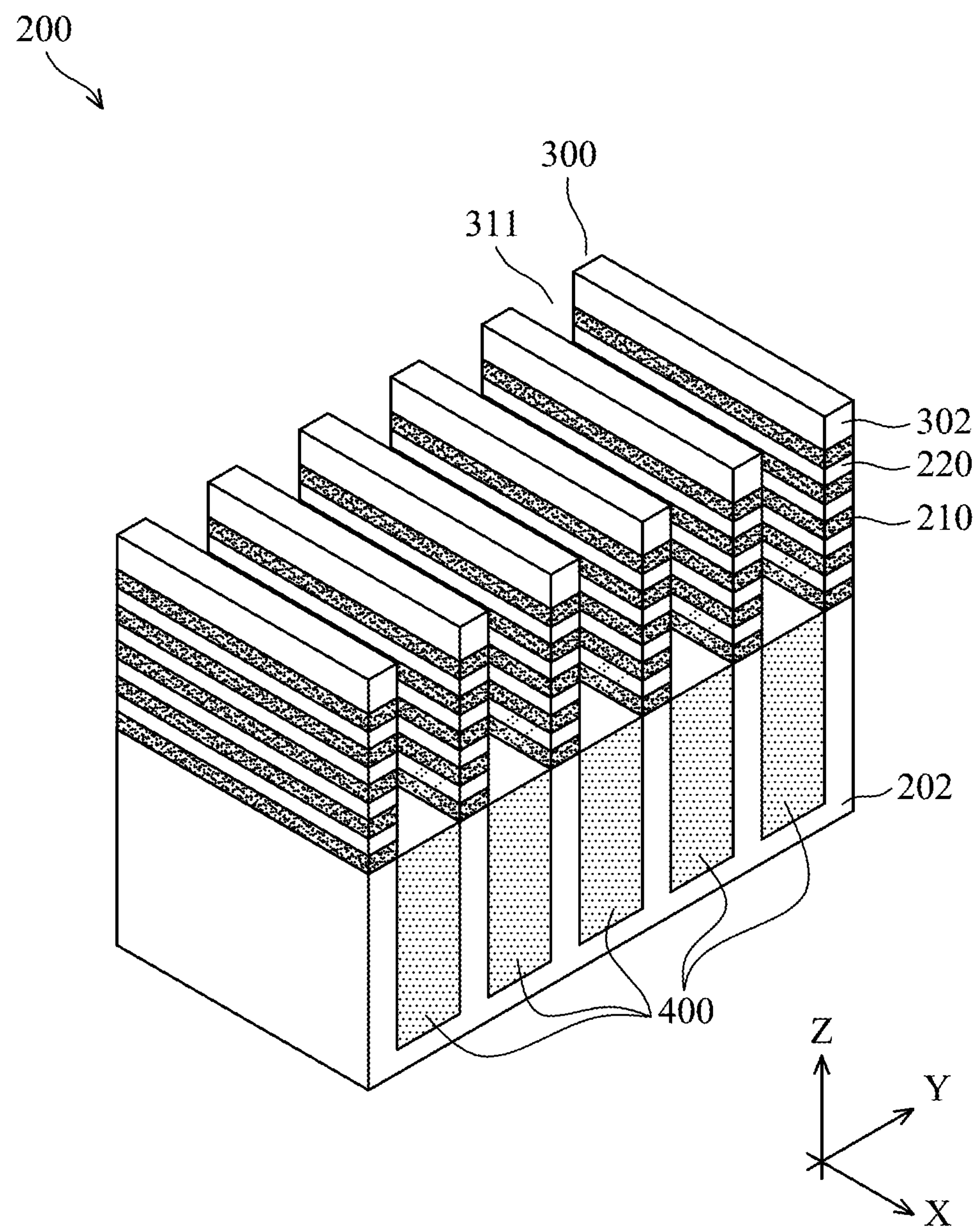

Corresponding to operation 106 of FIG. 1, FIG. 4 is a perspective view of the GAA transistor device 200 including isolation regions/structures 400 at one of the various stages of fabrication. As shown in the illustrated example of FIG. 4, each of the isolation structures 400 can be disposed between adjacent ones of the fin structures 300, and partially embed respective lower portions of the adjacent fin structures.

The isolation structures 400, which are formed of an insulation material, can electrically isolate neighboring active structures (e.g., fin structures 300) from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process, may remove any excess insulation material and form a top surface of the insulation material and a top surface of the patterned masks 302 that are coplanar (not shown). The patterned masks 302 may be removed by the planarization process, in some other embodiments.

Next, the insulation material is recessed to form the isolation structures 400, as shown in FIG. 4, which are sometimes referred to as shallow trench isolations (STIs). The isolation structures 400 are recessed such that the fin structures 300 protrude from between neighboring isolation structures 400. Respective top surfaces of the isolation structures (STIs) 400 may have a flat surface (as illustrated), a convex surface, a concave surface (such as dishing), or combinations thereof. The top surfaces of the isolation structures 400 may be formed flat, convex, and/or concave by an appropriate etch. The isolation structures 400 may be recessed using an acceptable etching process, such as one that is selective to the material of the isolation structures 400. For example, a dry etch or a wet etch using dilute hydrofluoric (DHF) acid may be performed to recess the isolation structures 400.

Figure 5:
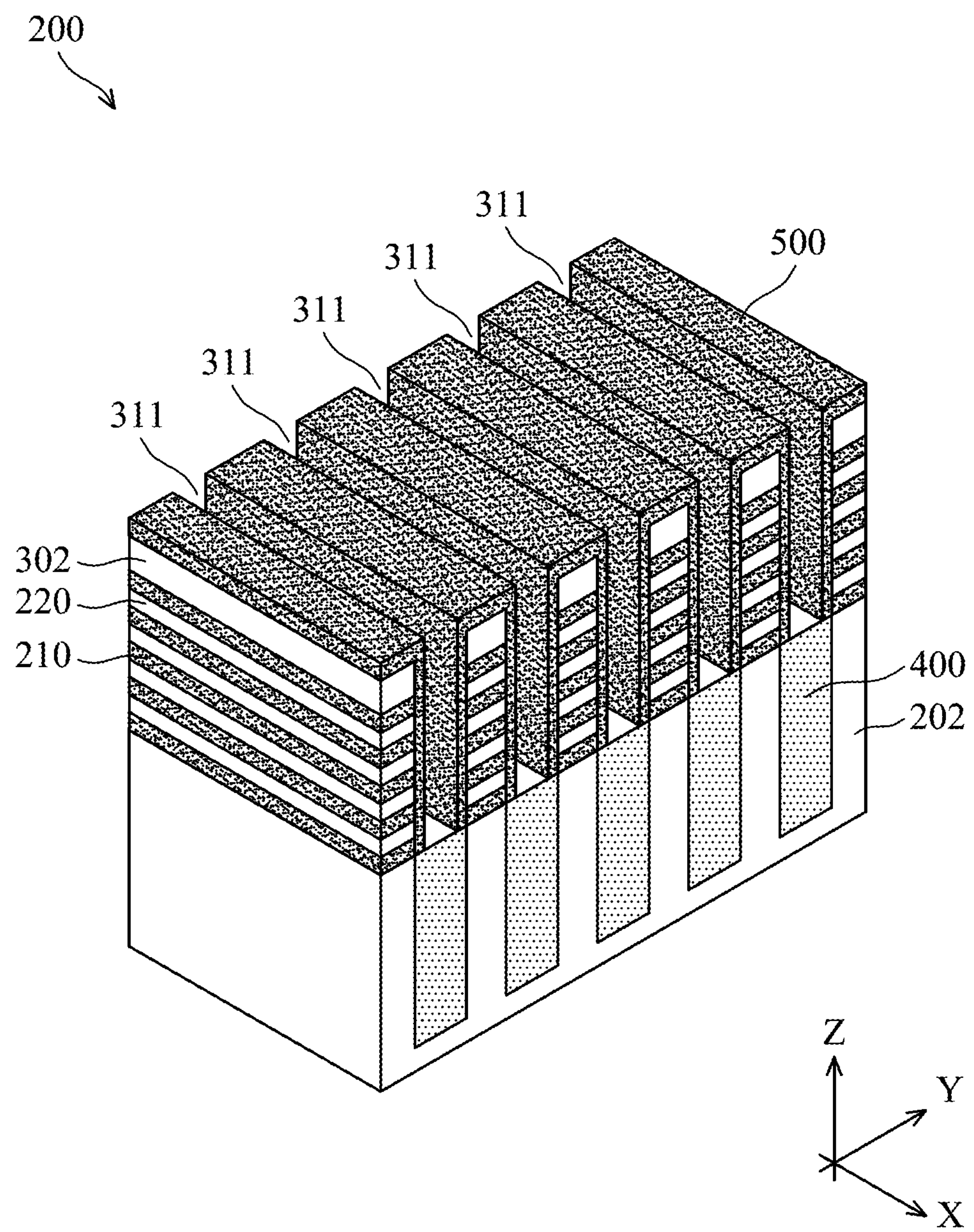

Corresponding to operation 108 of FIG. 1, FIG. 5 is a perspective view of the GAA transistor device 200 including a cladding layer 500 at one of the various stages of fabrication. As shown in the illustrated example of FIG. 5, the cladding layer 500 can extend along a top surface and sidewalls of each of the fin structures 300.

After the isolation structures 400 are formed, the cladding layer 500 may be conformally deposited over the fin structures 300. For example, the cladding layer 500 can be formed to overlay the top surface (with the patterned mask 302, if still present, disposed therebetween) and extend along the sidewalls of each of the fin structures 300. In various embodiments, the cladding layer 500 may be epitaxially grown from the fin structures 300. As such, a majority of the cladding layer 500 is formed around the fin structures 300, with a minority of the cladding layer 500 formed to overlay the isolation structures 400, as shown in FIG. 5. The cladding layer 500 may include the same material as one of the alternating first and second semiconductor layers, for example, the semiconductor layers that function as sacrificial layers. As will be discussed below, the semiconductor layers 210 may be later removed to cause the semiconductor layers 220 to be wrapped around by an active gate structure. Thus, in the example where the semiconductor layers 210 include silicon germanium, the cladding layer 500 may also include silicon germanium.

Figure 6:
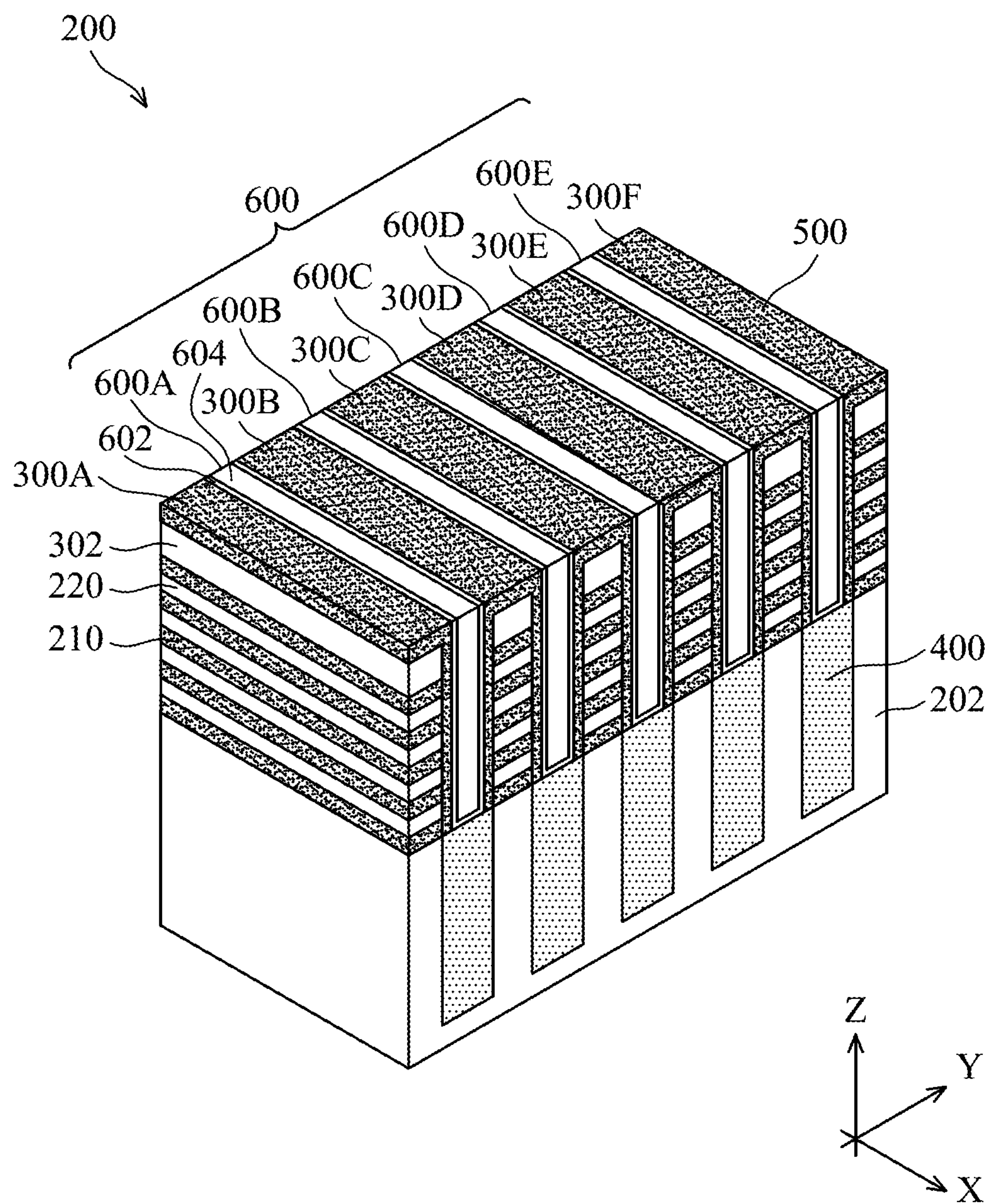

Corresponding to operation 110 of FIG. 1, FIG. 6 is a perspective view of the GAA transistor device 200 including a number of dummy fin structures 600A, 600B, 600C, 600D, and 600E (which may sometimes be referred to as dummy fin structures 600) at one of the various stages of fabrication. Each of the dummy fin structures 600, which extends in parallel with the fin structures (e.g., elongated along the X direction), is formed between adjacent ones of the fin structures 300 and over one of the isolation structures 400. For example in FIG. 6, the dummy fin structure 600B is disposed between the adjacent fin structures 300B and 300C.

In various embodiments, each of the dummy fin structures 600 includes a stress layer. Upon being deformed, the stress layer is configured to apply a certain type of mechanical deformation of adjacent structures. For example, when the GAA transistor device 200 is configured in n-type, the stress layer of the dummy fin structures 600, upon being deformed, can apply, impart, or otherwise induce a tensile stress/strain on one or more device structures (e.g., source/drain structures along the fin structures 300) formed adjacent to the dummy fin structures 600. By inducing the tensile stress on device structures, the crystal lattice of silicon in such device structures may be stretched, which can result in higher electron mobility during operation of the n-type GAA transistor device 200. In another example, when the GAA transistor device 200 is configured in p-type, the stress layer of the dummy fin structures 600, upon being deformed, can apply, impart, or otherwise induce a compressive stress/strain on one or more device structures (e.g., source/drain structures along the fin structures 300) formed adjacent to the dummy fin structures 600. By inducing the compressive stress on device structures, the crystal lattice of silicon in such device structures may be compressed, which can result in higher hole mobility during operation of the p-type GAA transistor device 200. Details of the tensile stress and compressive stress induced on the source/drain structures will be discussed below with respect to FIG. 16.

The dummy fin structures 600 may be formed by at least some of the following processes. For example, a interfacial layer 602 may be conformally deposited within the trenches 311 (FIG. 5) between the fin structures 300. The interfacial layer 602 may be optional. The interfacial layer 602 may include a dielectric material such as, for example, silicon oxynitride (SiON), silicon carbide (SiC), or combinations thereof. Other dielectric materials may be used. The interfacial layer 602 may be deposited using an atomic layer deposition (ALD) process.

After the interfacial layer 602 is formed, a stress layer 604 is deposited on the interfacial layer 602. In the example where the GAA transistor device 200 is configured in n-type, the stress layer 604 may include a deformable material, for example, silicon nitride (SiN). As will be discussed below, the stress layer 604 may be later deformed (e.g., compressed) through a suitable process, which can in turn stretch (e.g., induce a tensile stress on) the adjacent device structures. It should be understood that the stress layer 604 can include any of various other materials that can induce a tensile stress on adjacent device structures, while remaining within the scope of the present disclosure. In the example where the GAA transistor device 200 is configured in p-type, the stress layer 604 may include a deformable material, for example, silicon germanium. As will be discussed below, the stress layer 604 may be later deformed (e.g., expanded) through a suitable process, which can in turn compress (e.g., induce a compressive stress on) the adjacent device structures. It should be understood that the stress layer 604 can include any of various other materials that can induce a compressive stress on adjacent device structures, while remaining within the scope of the present disclosure. The stress layer 604 may be formed, for example, using a chemical vapor deposition (CVD) process. Other processes may be used as well.

Figure 7:
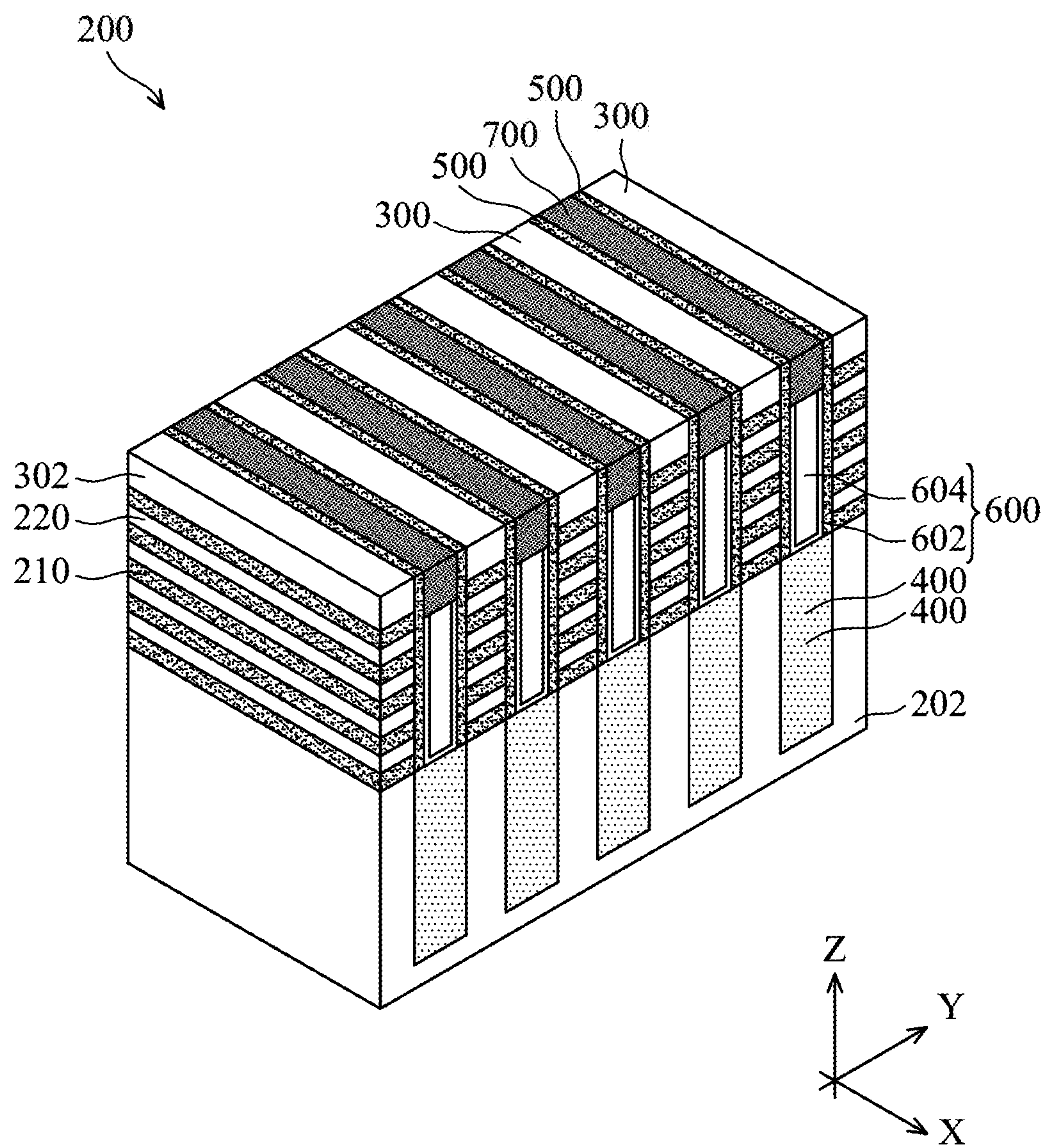

Corresponding to operation 112 of FIG. 1, FIG. 7 is a perspective view of the GAA transistor device 200 including a high-k dielectric layer 700 at one of the various stages of fabrication. As shown in the illustrated example of FIG. 7, the high-k dielectric layer 700 is formed to overlay a top surface of each of the dummy fin structures 600, which may have been recessed.

After the deposition of the stress layer 604, an etching process (which is sometimes referred to as an etching-back process) may then be applied to selectively remove an upper portion of each of the dummy fin structures 600 while leaving the cladding layer 500 substantially intact. The etching process may be, for example, a dry etching process. In some examples, the etching process is applied so that, after the etching process, the top surface of the dummy fin structures 600 is about 5-15 nanometers higher than a top surface of the topmost semiconductor layer 220 of each of the fin structures 300.

After the dummy fin structures 600 have been partially etched back, the high-k dielectric layer 700 can be deposited at the top of the dummy fin structures 600. For example, the high-k dielectric layer 700 may fill the space left by the etching process that etches back the stress layer 604 (and the optional interfacial layer 602). The high-k dielectric layer 700 may include a dielectric material such as, for example, hafnium oxide ($HfO_2$), zirconium oxide ($ZrO_2$), hafnium aluminum oxide (HfAlOx), hafnium silicon oxide (HfAlOx), aluminum oxide ($Al_2O_3$), or combinations thereof. In some embodiments, a bottom surface of the high-k dielectric layer 700 may be about 5-15 nanometers higher than the top surface of the topmost semiconductor layer 220 of each of the fin structures 300.

Next, a chemical mechanical polishing (CMP) process may be applied to planarize a top surface of the workpiece (e.g., the partially formed GAA transistor device 200). A CMP process involves applying a slurry to the surface of the workpiece. The slurry includes etching chemicals as well as solid particles. A polishing head is then moved across the surface of the workpiece and the chemical and mechanical forces on the workpiece result in removing material from the workpiece at a substantially similar rate so as to create a planar surface. In some embodiments, the patterned mask 302 may be removed during this CMP process. In some embodiments, the CMP process may remove the portions of the cladding layer 500, the dummy fin structures 600, and the high-k dielectric layer 700 that are above the patterned mask 302, with the patterned mask 302 remained intact, as shown in the following figures.

Figure 8:
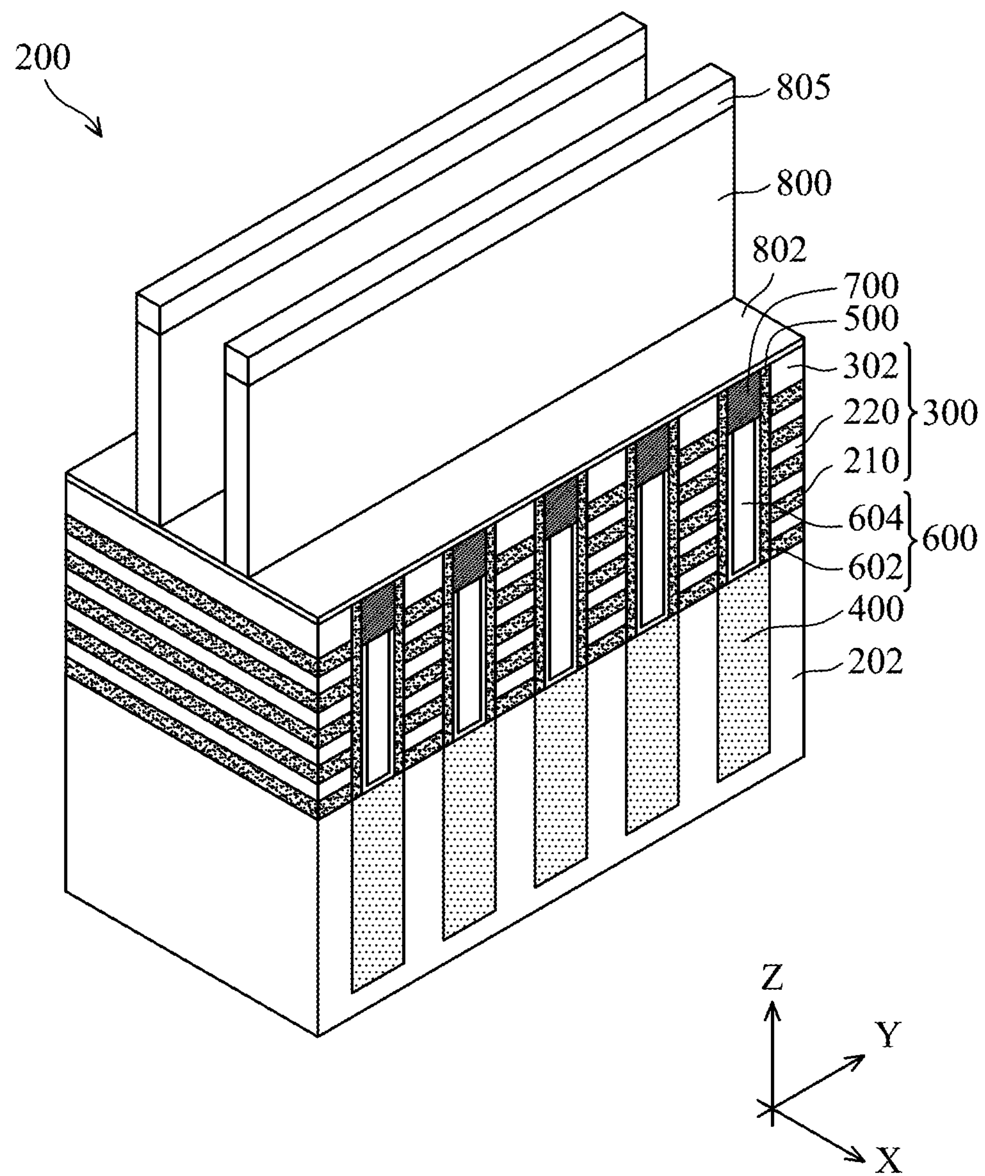

Corresponding to operation 114 of FIG. 1, FIG. 8 is a perspective view of the GAA transistor device 200 including one or more dummy gates structures 800 at one of the various stages of fabrication. As shown in the illustrated example of FIG. 8, the dummy gate structures 800, extending along a lateral direction (e.g., the Y direction) perpendicular to the lateral direction along which the structures 300 and 600 extend, can be formed over the workpiece. The dummy gate structure is placed where an active (e.g., metal) gate structure may later be formed, in various embodiments.

After the formation of the high-k dielectric layer 700, an etching stop layer 802 can be formed over a substantially planar top surface shared by the fin structures 300, the cladding layer 500, and the dummy fin structures 600 (overlaid or protected by the high-k dielectric layer 700). As used herein, the term "substantially planar" refers to a structure when the deviation of the structure from a plane is within the statistical atomic level variations inherent within semiconductor processing methods known in the art. The etching stop layer 802 may include silicon oxide. The etching stop layer 802 may be formed by a deposition process, such as CVD (such as PECVD, HARP, or combinations thereof) process, ALD process, another applicable process, or a combination thereof.

Next, the dummy gate structures 800 are formed over the etching stop layer 802. The dummy gate structure 800 includes a dummy gate dielectric (not shown) and a dummy gate (not shown), in some embodiments. A mask 805 may be formed over the dummy gate structure 800. To form the dummy gate structure 800, a dielectric layer is formed over the etch stop layer 802. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is then formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 805. The pattern of the mask 805 then may be transferred to the gate layer and the dielectric layer by a suitable etching technique to form the dummy gate structures 800. The dummy gate structures 800 each cover a respective central portion (e.g., a channel region) of each of the fin structures 300 and the dummy fin structures 600.

Figure 9:
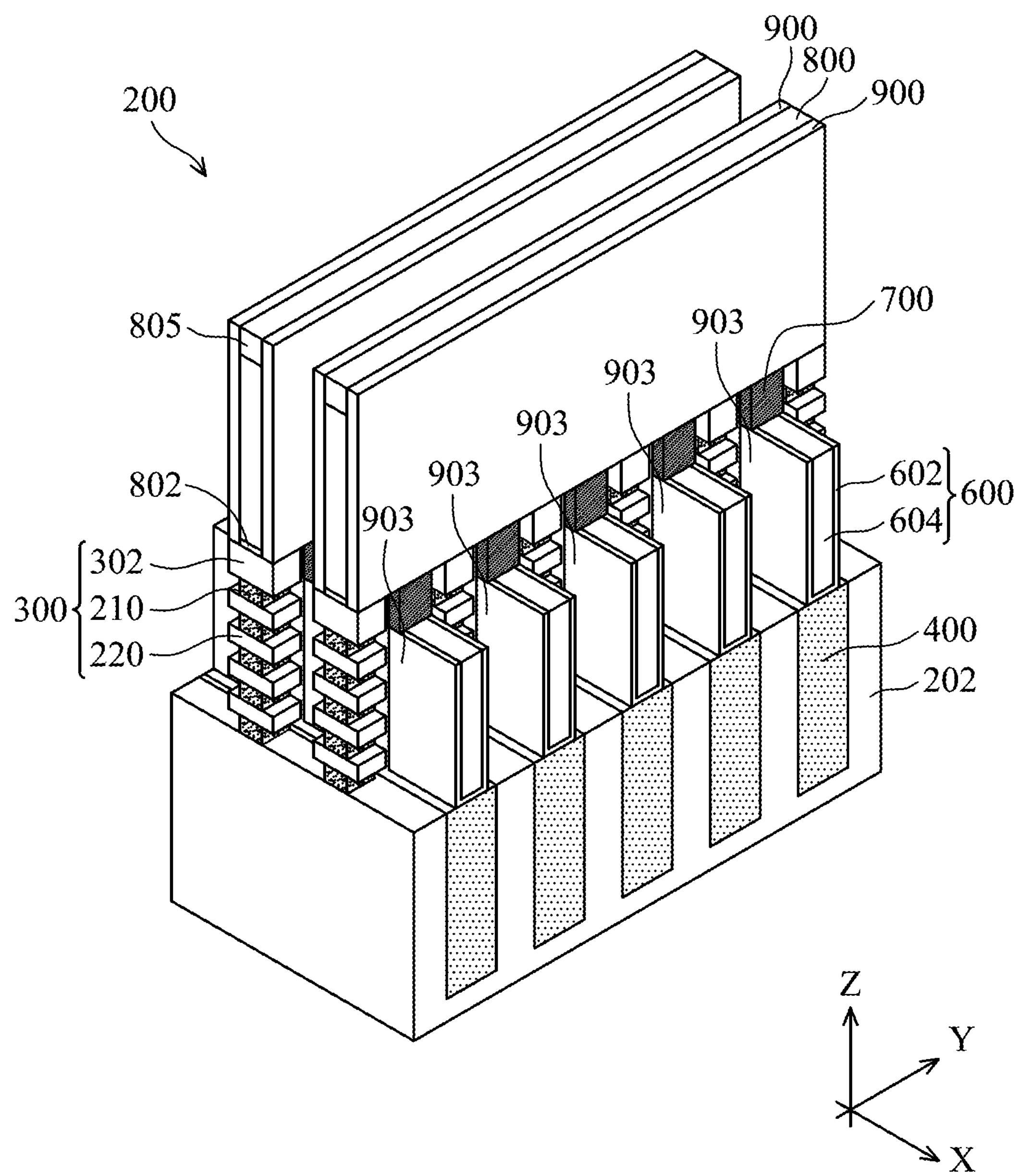

Corresponding to operation 116 of FIG. 1, FIG. 9 is a perspective view of the GAA transistor device 200 in which respective end portions of the fin structures 300 are removed at one of the various stages of fabrication. As shown in the illustrated example of FIG. 9, the end portions of each of the fin structures 300 that are not covered by the dummy gate structures 800 (and corresponding gate spacers 900) can be removed.

After the formation of the dummy gate structures 800, the gate spacer 900 may be formed on opposing sidewalls (along the X direction) of each of the dummy gate structures 800. The gate spacer 900 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 900. The shapes and formation methods of the gate spacer 900 as illustrated and described in FIG. 9 are merely non-limiting examples, and other shapes and formation methods are possible. These and other variations are fully intended to be included within the scope of the present disclosure.

Next, the end portions of the fin structures 300 that are not covered by the dummy gate structures 800 and the gate spacers 900 are removed by, for example, an anisotropic etching process using the dummy gate structures 800 as an etching mask, although any other suitable etching process may also be used. Upon the end portions of the fin structures 300 being removed, source/drain recesses 903 are formed. The source/drain recesses 903 can each expose respective "shortened" ends (along the X direction) of each of the semiconductor layers 210 and 220. Concurrently with forming the source/drain recesses 903, a portion of the high-k dielectric layer 700 and a portion of the cladding layer 500 that are not overlaid by the dummy gate structures 800 and the gate spacers 900 can be removed.

In some embodiments, the high-k dielectric layer 700 includes a high-k dielectric material with a dielectric constant value greater than about 7, and the stress layer 604 and interfacial layer 602 of the dummy fin structure 600 each include a low-k dielectric material with a dielectric constant value less than about 7, which may result in the high-k dielectric layer 700 and dummy fin structure 600 having different etching selectivities (e.g., etching rates). For example, after the portion of the high-k dielectric layer 700 not covered by the dummy gate structure 800 is removed, the dummy fin structure 600 directly below the removed portion of the high-k dielectric layer 700 may remain substantially intact given that the etching selectivity of the high-k dielectric layer 700 over the dummy fin structure 600 is relatively high.

Upon the ends of the semiconductor layers 210 and 220 being exposed (e.g., when forming the source/drain recesses 903), respective end portions of each of the semiconductor layers 210 and a portion of the cladding layer 500 (overlaid by the dummy gate structures 800 and gate spacers 900) may be concurrently removed, as the semiconductor layers 210 and the cladding layer 500 include the similar material. The end portions of the semiconductor layers 210 and the portion of the cladding layer 500 can be removed (e.g., etched) using a "pull-back" process to pull the semiconductor layers 210 and cladding layer 500 back by an initial pull-back distance such that the ends of the semiconductor layers 210 terminate underneath (e.g., aligned with) the gate spacer 900. It is understood that the pull-back distance (i.e., the extent to which each of the semiconductor layers 210 is etched, or pulled-back) can be arbitrarily increased or decreased. In an example where the semiconductor layers 220 include Si, and the semiconductor layers 210 (together with the cladding layer 500) include $Si_{1-x}Ge_x$, the pull-back process may include a hydrogen chloride (HCL) gas isotropic etch process, which etches SiGe without attacking Si. As such, the semiconductor layers 220 may remain substantially intact during this process.

Figure 10:
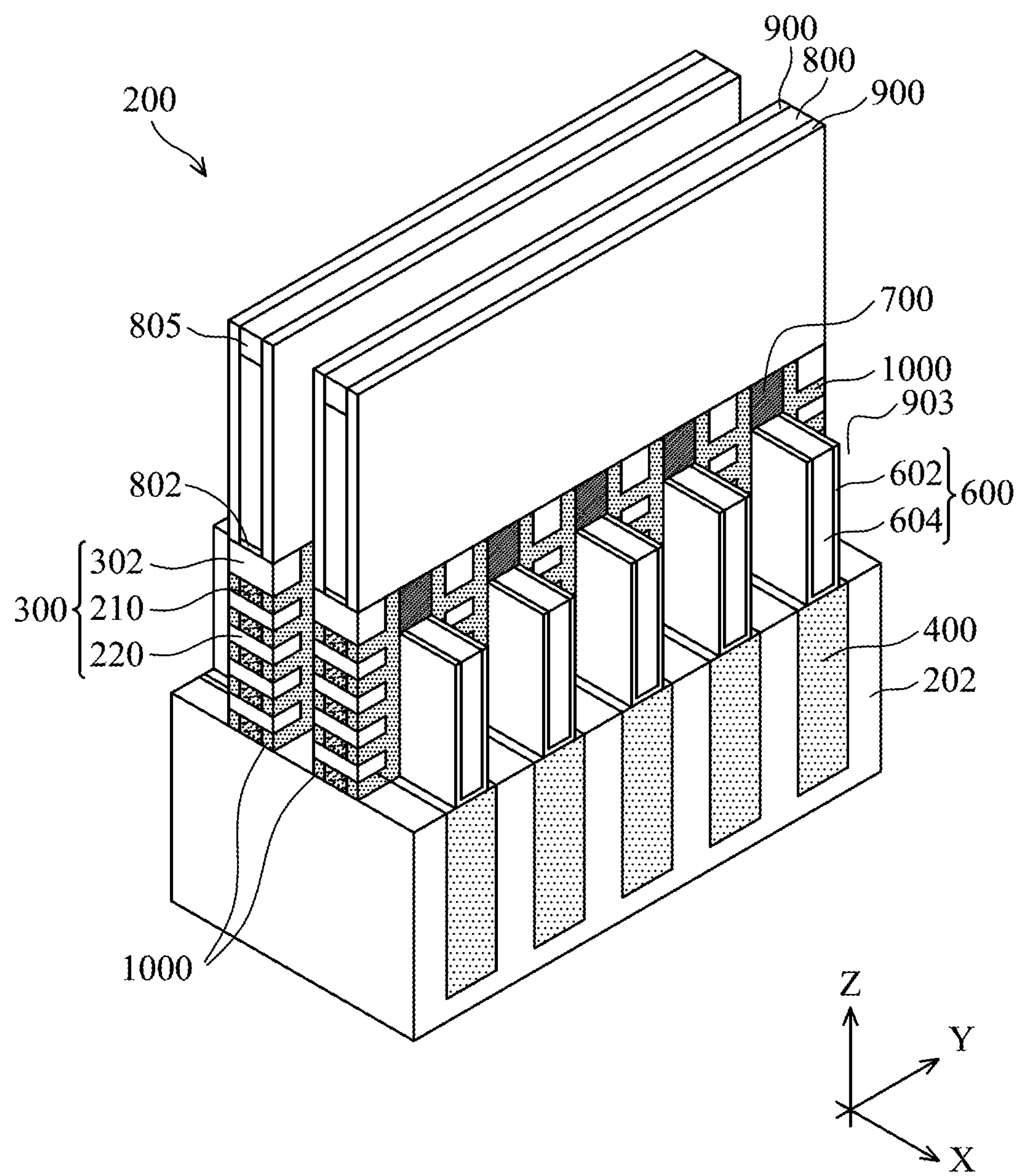

Corresponding to operation 118 of FIG. 1, FIG. 10 is a perspective view of the GAA transistor device 200 including inner spacers 1000 along the fin structures 300 at one of the various stages of fabrication. As shown in the illustrated example of FIG. 10, the inner spacers 1000 can be formed along the etched ends of each of the semiconductor layers 210 and along respective ends (along the Y direction) of each of the semiconductor layers 210 and 220.

The inner spacers 1000 can be formed conformally by chemical vapor deposition (CVD), or by monolayer doping (MLD) of nitride followed by spacer RIE. The inner spacers 1000 can be deposited using, e.g., a conformal deposition process and subsequent isotropic or anisotropic etch back to remove excess spacer material on the sidewalls of the fin structures 300 and on a surface of the semiconductor substrate 202. A material of the inner spacers 1000 can be formed from the same or different material as the gate spacer 900 (e.g., silicon nitride). For example, the inner spacers 1000 can be formed of silicon nitride, silicoboron carbonitride, silicon carbonitride, silicon carbon oxynitride, or any other type of dielectric material (e.g., a dielectric material having a dielectric constant less than about 5) appropriate to the role of forming an insulating gate sidewall spacers of transistors.

Figure 11:
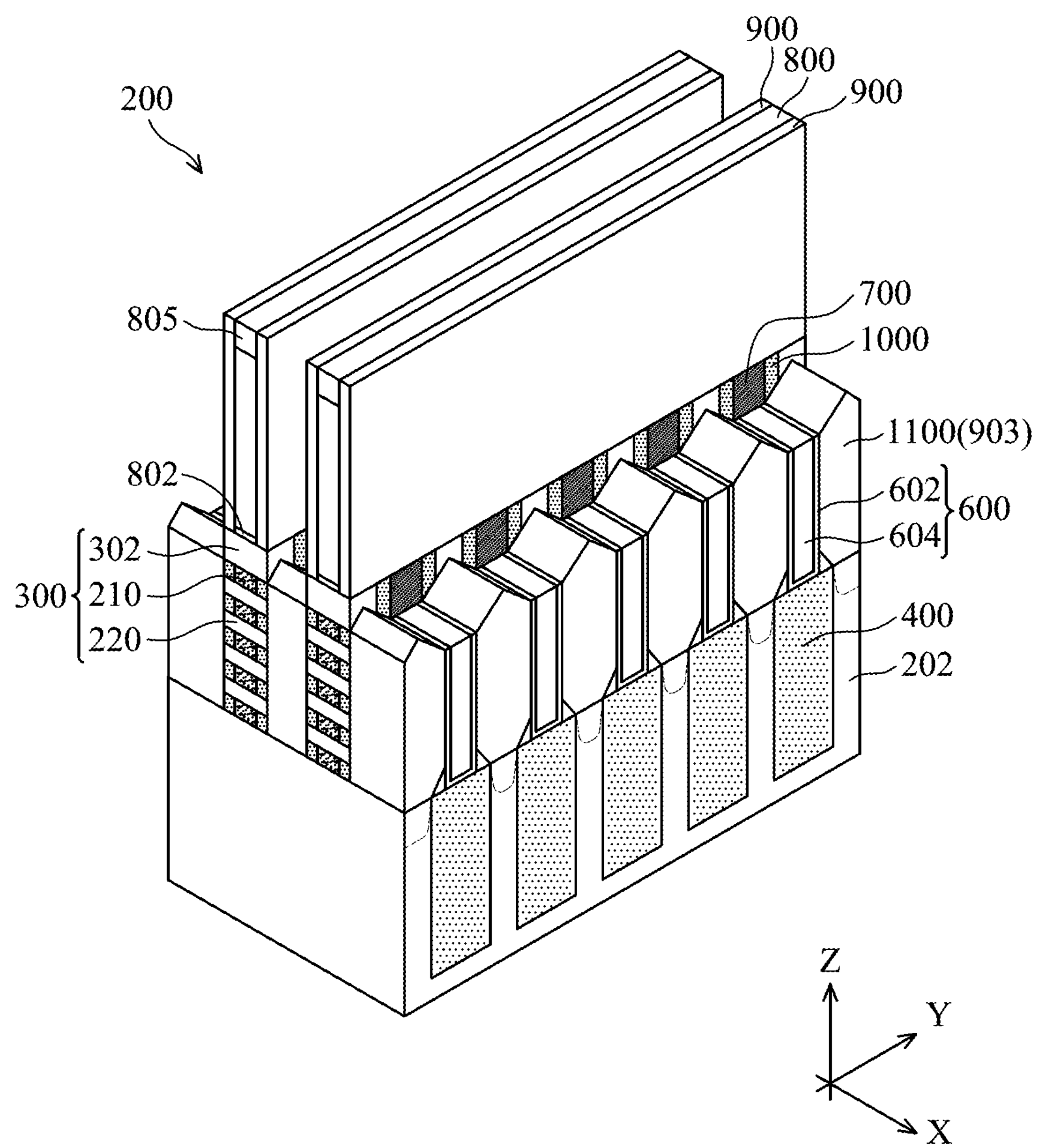

Corresponding to operation 120 of FIG. 1, FIG. 11 is a perspective view of the GAA transistor device 200 including source/drain structures 1100 at one of the various stages of fabrication. As shown in the illustrated example of FIG. 11, the source/drain structures 1100 are formed in the source/drain recesses 903, respectively. The source/drain structures 1100 are coupled to respective ends (along the X direction) of the fin structures 300, e.g., the respective "shortened" or "etched" ends of each of the semiconductor layers 220.

The source/drain structures 1100 may each include silicon germanium (SiGe), indium arsenide (InAs), indium gallium arsenide (InGaAs), indium antimonide (InSb), germanium arsenide (GeAs), germanium antimonide (GaSb), indium aluminum phosphide (InAlP), indium phosphide (InP), or combinations thereof. The source/drain structures 1100 may be formed using an epitaxial layer growth process on exposed ends of each of the semiconductor layers 220. For example, the growth process can include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epitaxial processes. In some embodiments, a bottom surface of the source/drain structures 1100 may be leveled with the top surface of the isolation structure 400, as shown in solid lines of FIG. 11. In some other embodiments, the bottom surface of the source/drain structures 1100 may be lower than the top surface of the isolation structure 400, as shown in dotted lines of FIG. 11.

In-situ doping (ISD) may be applied to form doped source/drain structures 1100, thereby creating the junctions for the GAA transistor device 200. For example, when the GAA transistor device 200 is configured in n-type, the source/drain structures 1100 can be doped by implanting n-type dopants, e.g., arsenic (As), phosphorous (P), etc., into them. When the GAA transistor device 200 is configured in p-type, the source/drain structures 1100 can be doped by implanting p-type dopants, e.g., boron (B), etc., into them.

Figure 12:
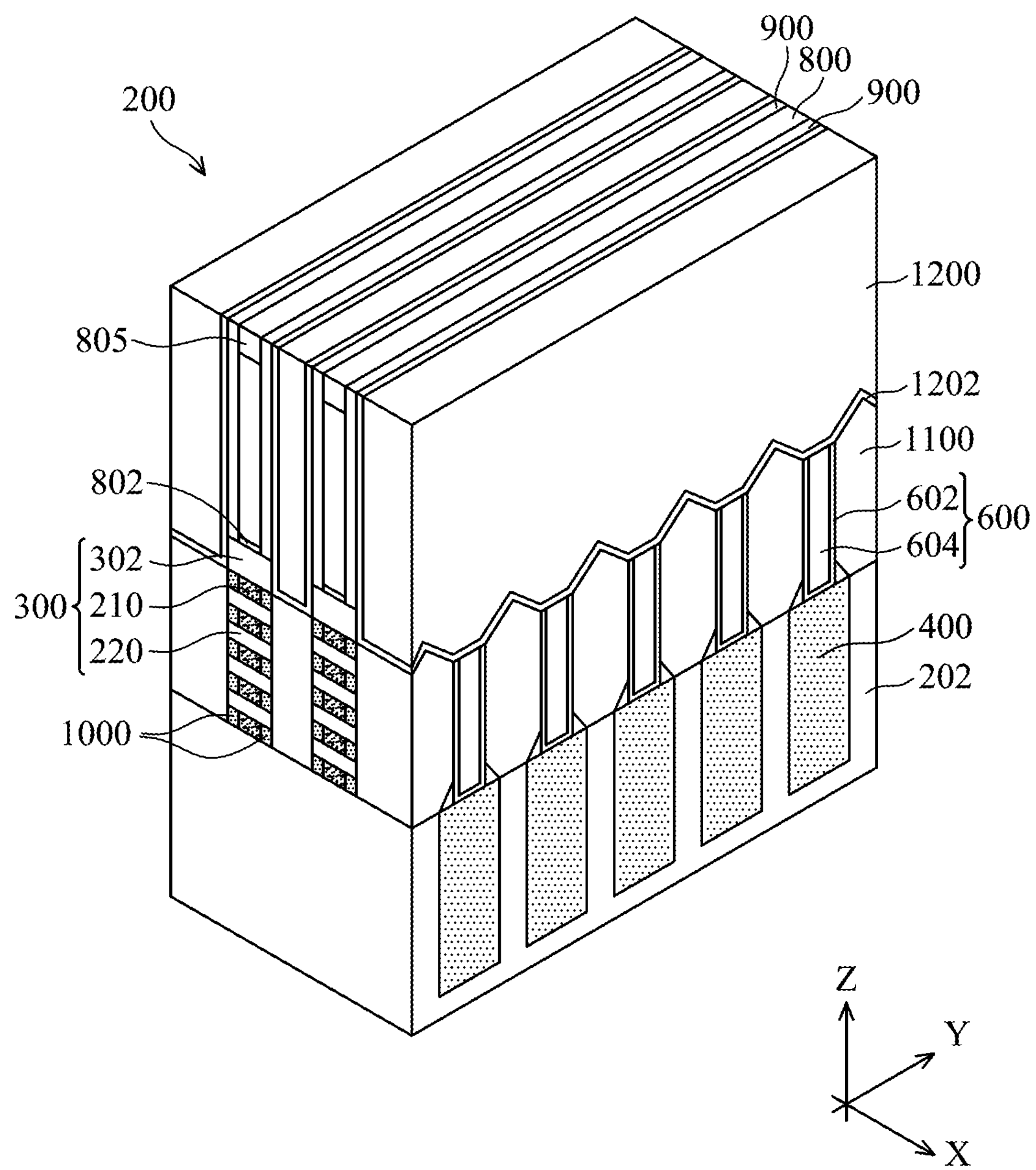

Corresponding to operation 122 of FIG. 1, FIG. 12 is a perspective view of the GAA transistor device 200 including an inter-layer dielectric (ILD) 1200 at one of the various stages of fabrication. As shown in the illustrated example of FIG. 12, the ILD 1200 is formed on opposing sides (along the X direction) of each of the dummy gate structures 800 to overlay the source/drain structures 1100 and the dummy fin structures 600, with a contact etch stop layer 1202 disposed therebetween.

The contact etch stop layer 1202 may be first formed over the source/drain structures 1100, the dummy fin structures 600, and the dummy gate structures 800. The contact etch stop layer 1202 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 1200 is formed over the contact etch stop layer 1202. In some embodiments, the ILD 1200 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. Next, a planarization process, such as a CMP process, may be performed to achieve a level top surface for the ILD 1200. The CMP may also remove the mask 805 (FIG. 11) and portions of the contact etch stop layer 1202 disposed over the mask 805. After the planarization process, the top surface of the ILD 1200 is level with a top surface of the dummy gate structures 800, in some embodiments.

Figure 13:
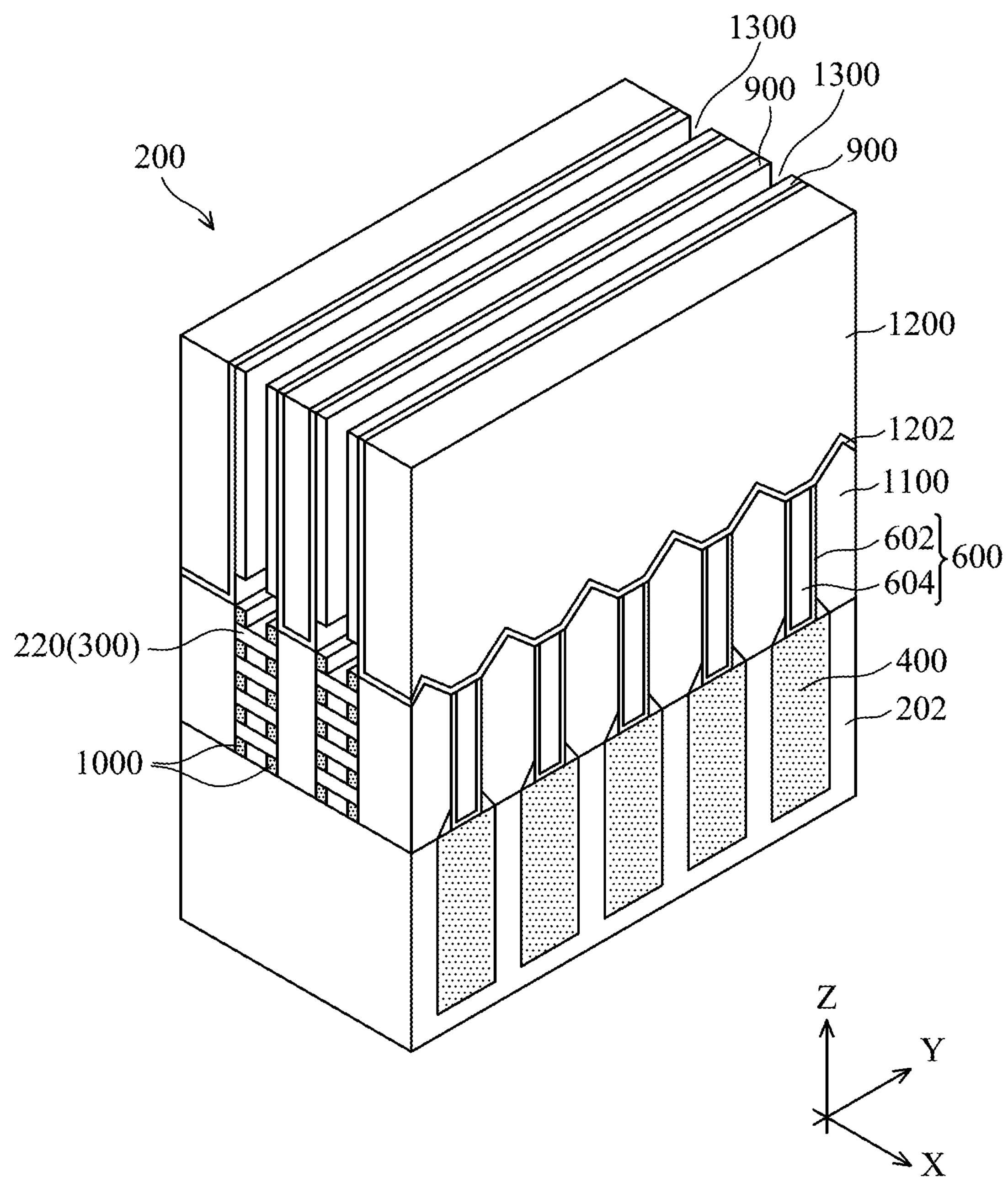

Corresponding to operation 124 of FIG. 1, FIG. 13 is a perspective view of the GAA transistor device 200 in which the dummy gate structures 800, the etch stop layer 802, the patterned mask 302 (if still present), and the semiconductor layers 210 are sequentially removed at one of the various stages of fabrication. As illustrated in the example of FIG. 13, after the removal of the dummy gate structures 800, the etch stop layer 802, the patterned mask 302, and the semiconductor layers 210, gate trenches 1300 are formed. Further, the semiconductor layers 220, which have been vertically separated from one other, are suspended.

Subsequently to forming the ILD 1200 and exposing the dummy gate structures 800 (FIG. 12), the dummy gate structures 800, the etch stop layer 802, the patterned mask 302 (if still present), and the semiconductor layers 210 are sequentially removed. The dummy gate structures 800, the etch stop layer 802, and the patterned mask 302 (if any) can be removed by an etching process, e.g., RIE or chemical oxide removal (COR). After removing the dummy gate structures 800, the etch stop layer 802, and the patterned mask 302, the top surface of each of the fin structures 300 (e.g., the top surface of the topmost semiconductor layers 210) is exposed. In addition to the top surface, sidewalls of each fin structure 300 (facing the Y direction) may be exposed. Next, the semiconductor layers 210 are removed from each of the fin structures 300 by applying a selective etch (e.g., a hydrochloric acid (HCl)), while leaving the semiconductor layers 220 substantially intact. After the removal of the semiconductor layers 210, respective bottom surface and top surface of each of the semiconductor layers 220 may be exposed.

Corresponding to operation 126 of FIG. 1, FIG. 14 is a perspective view of the GAA transistor device 200 including one or more masks 1400 at one of the various stages of fabrication. For clarity of illustration, FIG. 15 is a corresponding cross-sectional view of the GAA transistor device 200 that is cut along cross-section A-A' (e.g., along a longitudinal direction of the gate trench 1300) indicated in FIG. 14.

As illustrated in the example of FIGS. 14-15, the masks 1400 may be formed over and in the gate trench 1300 (as indicated in dotted lines in FIG. 15) to overlay some of the dummy fin structures 600, e.g., the dummy fin structures 600B and 600D. The masks 1400 may also overlay the respective portions of the high-k dielectric layer 700 in the gate trench 1300 that are disposed above those dummy fin structures. Next, an etching process may be performed to remove the portions of the high-k dielectric layer 700 that are not overlaid by the masks 1400 (e.g., the portions of the high-k dielectric layer 700 that are disposed above the dummy fin structures 600A, 600C, and 600E). Upon patterning the high-k dielectric layer 700 in the gate trench 1300 using the masks 1400, the masks 1400 may be removed.

In some embodiments, such remaining or patterned portions of the high-k dielectric layer 700 may help to electrically isolate respective gates of a plurality of transistors. For example, an active gate structure wrapping around each of the semiconductor layers 220 (which will be described with respect to FIGS. 17-18) may be cut or otherwise separated into multiple portions or segments by the remaining portions of the high-k dielectric layer 700. As such, respective transistors, each of which includes its respective gate (e.g., one of a plurality of the separated portions of the active gate structure), can be defined, which will be discussed in further detail below with respect to FIGS. 19-20.

Figure 16:
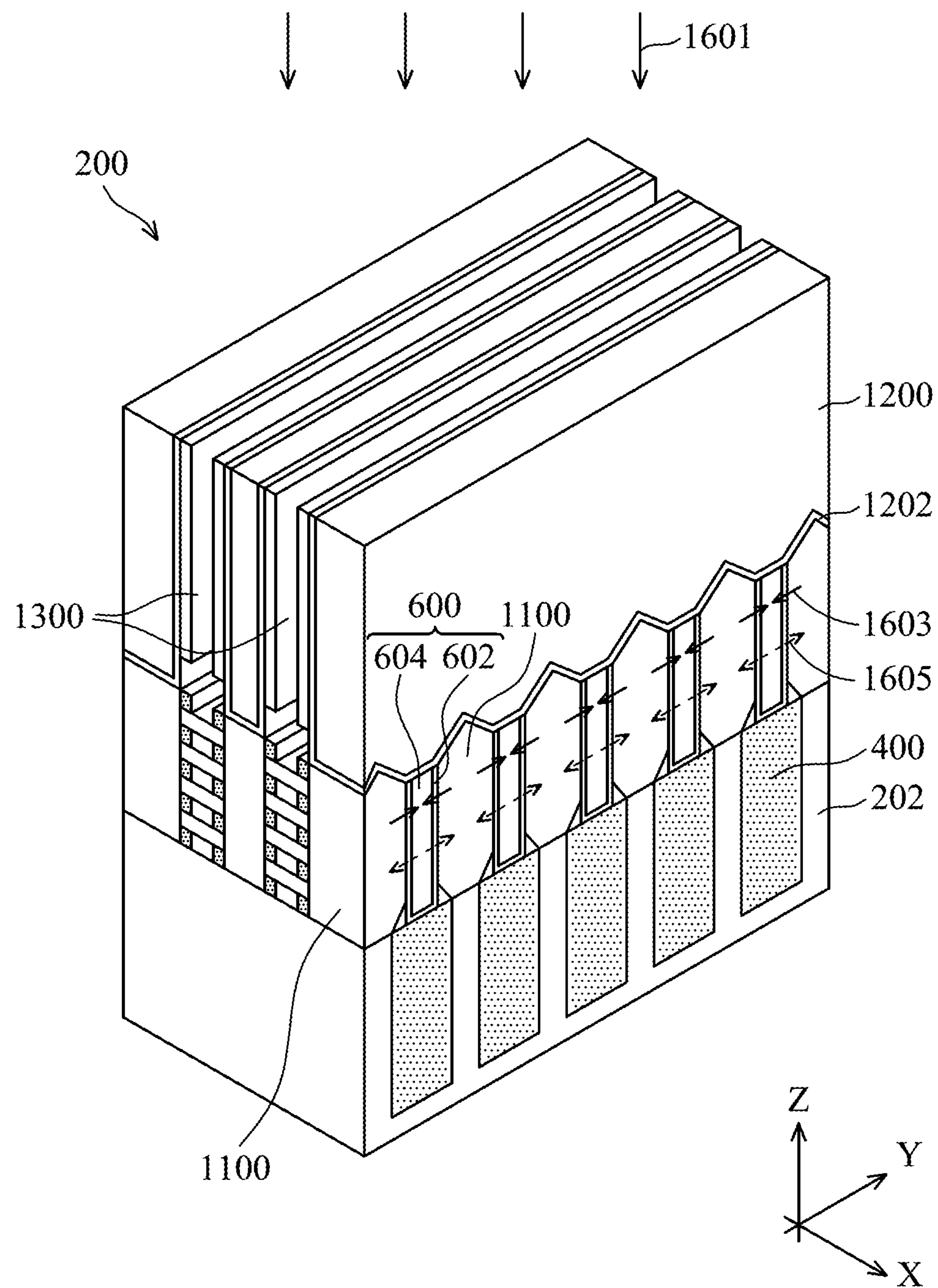

Corresponding to operation 128 of FIG. 1, FIG. 16 is a perspective view of the GAA transistor device 200 in which a process 1601 is performed to deform the stress layer 604 of each of the dummy gate structures at one of the various stages of fabrication. The process 1601 is configured to cause the stress layer 604 of each of the dummy fin structures 600 to experience a certain type of mechanical deformation, thereby inducing a tensile or compressive stress on the adjacent source/drain structures 1100.

In various embodiments, when the GAA transistor device 200 is configured in n-type, the process 1601 may include annealing the stress layer 604 in an elevated temperature of about 600° C.~800° C. for about 30~60 minutes. Further, when annealing the stress layer 604, the workpiece may be placed in a chamber with an inert gas, e.g., nitrogen. Upon performing the annealing process 1601, the silicon germanium of the stress layer 604 of each of the dummy fin structures 600 can be compressed (as indicated in solid lines 1603), which can in turn induce a tensile stress/strain on the source/drain structures 1100 formed adjacent to the dummy fin structures 600. As such, the distance between the atoms of the source/drain structures 1100 may be stretched, which can advantageously increase the mobility of electrons conducted in the n-type GAA transistor device 200.

When the GAA transistor device 200 is configured in p-type, the process 1601 may include oxidizing the stress layer 604 in an elevated temperature of about 400° C.~600° C. for about 30~90 minutes. Further, when oxidizing the stress layer 604, the workpiece may be placed in a chamber with a gas of oxides of hydrogen, e.g., hydrogen oxide. Upon performing the oxidizing process 1601, the silicon germanium of the stress layer 604 of each of the dummy fin structures 600 can be expanded (as indicated in dotted lines 1605) to become germanium oxide ($GeO_x$), which can in turn induce a compressive stress/strain on the source/drain structures 1100 formed adjacent to the dummy fin structures 600. As such, the distance between the atoms of the source/drain structures 1100 may be compressed, which can advantageously increase the mobility of holes conducted in the p-type GAA transistor device 200.

Corresponding to operation 130 of FIG. 1, FIG. 17 is a perspective view of the GAA transistor device 200 including one or more active gate structures 1700 at one of the various stages of fabrication. For clarity of illustration, FIG. 18 is a corresponding cross-sectional view of the GAA transistor device 200 that is cut along cross-section A-A' (e.g., along a longitudinal direction of one of the active gate structures 1700) indicated in FIG. 17.

Each of the active gate structures includes a gate dielectric and a gate metal, in some embodiments. For example in FIG. 18, each of the active gate structures 1700 includes a gate dielectric 1702 and a gate metal 1704.

As shown in FIG. 18, the gate dielectric 1702 wraps around each of the semiconductor layers 220, e.g., the top and bottom surfaces and sidewalls perpendicular to the Y direction). The gate dielectric 1702 may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric 1702 may include a stack of multiple high-k dielectric materials. The gate dielectric 1702 can be deposited using any suitable method, including, for example, molecular beam deposition (MBD), atomic layer deposition (ALD), PECVD, and the like. In some embodiments, the gate dielectric 1702 may optionally include a substantially thin oxide (e.g., $SiO_x$) layer.

The gate metal 1704 can wrap around each of the semiconductor layers 220 with the gate dielectric 1702 disposed therebetween. Specifically, the gate metal 1704 can include a number of gate metal sections abutted to each other along the Z direction. Each of the gate metal sections can extend not only along a horizontal plane (e.g., the plane expanded by the X direction and the Y direction), but also along a vertical direction (e.g., the Z direction). As such, two adjacent ones of the gate metal sections can adjoin together to wrap around a corresponding one of the semiconductor layers 220, with the gate dielectric 1702 disposed therebetween.

The gate metal 1704 may include a stack of multiple metal materials. For example, the gate metal 1704 may be a p-type work function layer, an n-type work function layer, multilayers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

Corresponding to operation 132 of FIG. 1, FIG. 19 is a perspective view of the GAA transistor device 200 including gate cut structures 1902 and 1904 at one of the various stages of fabrication. For clarity of illustration, FIG. 20 is a corresponding cross-sectional view of the GAA transistor device 200 that is cut along cross-section A-A' (e.g., along a longitudinal direction of one of the active gate structures 1700) indicated in FIG. 19.

Upon forming the active gate structures 1700, an upper portion of the gate metal 1704 may be removed. In some embodiments, the upper portion of the gate electrode layer 156 is removed by a planarizing process, e.g., a CMP process, until the patterned portions of the high-k dielectric layer 700 (as illustrated in FIG. 20) are again exposed. Next, the remaining portion of the gate metal 1704 is etched back by an etching process, therefore causing the patterned portions of the high-k dielectric layer 700 to protrude above a top surface of the gate metal 1704. The patterned portions of the high-k dielectric layer 700 can cut the gate metal 1704, which causes a number of gate metal segments 1704A, 1704B, and 1704C to be formed. The gate metal segments 1704A and 1704B are separated by the dummy fin structure 600B and the portion of the high-k dielectric layer 700 disposed thereon; and the gate metal segments 1704B and 1704C are separated by the dummy fin structure 600D and the portion of the high-k dielectric layer 700 disposed thereon.

Next, a conductive layer 1900 is selectively formed over the gate metal 1704, and a dielectric layer 1901 is formed over the conductive layer 1900. The conductive layer 1900 is configured to reduce the resistance of the gate metal 1704. In some embodiments, the conductive layer 1900 may include tungsten (W). The conductive layer 1900 may be selectively formed over the gate metal 1704, but not formed over the patterned portions of the high-k dielectric layer 700. In some embodiments, the dielectric layer 1901 may include silicon nitride, silicon oxynitride (SiON), silicon carbide (SiC), another applicable insulating material, or combinations thereof.

In some embodiments, prior to the formation of the conductive layer 1900, a surface treatment process may be performed on the top surface of the gate metal 1704 (e.g., the gate metal segments 1704A-C) to generate some hydrogen radicals, and then a deposition process with a precursor is performed on the treated top surface of the gate metal 1704 to selectively form the conductive layer 1900 on the gate metal segments 1704A-C. The surface treatment process can include using hydrogen ($H_2$) gas to generate hydrogen radicals. The precursor, which can include tungsten (W)-containing material such as, for example, tungsten hexafluoride ($WF_6$) or tungsten hexachloride ($WCl_6$), can react with the hydrogen radicals to selectively form the conductive layer 1900.

Next, the gate cut structures 1902 and 1904 can be formed in the dielectric layer 1901. In some embodiments, the gate cut structures 1902 and 1904 may include silicon nitride, silicon oxynitride (SiON), silicon carbide (SiC), another applicable insulating material, or combinations thereof. After the dielectric layer 1901 is deposited, it may be patterned to form trenches extending therethrough and exposing the patterned portions of the high-k dielectric layer 700. The gate cut features 1902 and 1904 are then formed by filling the trenches with at least one of the forgoing insulating materials. The gate cut features 1902 and 1904 can be used to further electrically isolate the gate metal segments 1704A-C. For example, the gate cut feature 1902 can electrically isolate the gate metal segments 1704A and 1704B: and the gate cut feature 1904 can electrically isolate the gate metal segments 1704B and 1704C. In some other embodiments, the conductive layer 1900 may globally be formed over the workpiece, e.g., overlaying both the gate metal 1704 and the patterned portions of the high-k dielectric layer 700. As such, after depositing the dielectric layer 1901 over the conductive layer 1900, the above-mentioned trenches may be formed to extend through both of the dielectric layer 1901 and the conductive layer 1900, thereby causing the gate cut features to electrically isolate the gate metal segments 1704A-C.

In accordance with various embodiments, the gate metal segments 1704A-C may function as respective gates of a number of transistors. As a non-limiting example, the gate metal segment 1704A may function as the gate of a first GAA transistor that has the semiconductor layers 220 of the fin structures 300A-B as its conduction channel; the gate metal segment 1704B may function as the gate of a second GAA transistor that has the semiconductor layers 220 of the fin structures 300C-D as its conduction channel; and gate metal segment 1704C may function as the gate of a third GAA transistor that has the semiconductor layers 220 of the fin structures 300E-F as its conduction channel. Further, the source/drain structures 1100 formed on respective ends of each of the conduction channels may function as respective source and drain of the corresponding GAA transistor.

Although the above-described operations of the method 100 are directed to forming the GAA transistor device 200 in either an n-type or p-type, it should be appreciated that the method 100 is not limiting thereto. In other words, the method 100 can be used to form a GAA transistor device having both n-type and p-type GAA transistors, wherein the n-type GAA transistors each have its source/drain structure mechanically stretched and the p-type GAA transistors each have its source/drain structure mechanically compressed.

For example, the first region of a semiconductor substrate may be defined to form a number of n-type GAA transistors, and the second region of the semiconductor substrate may be defined to form a number of p-type GAA transistors by forming fin structures (e.g., 300) having different conduction types in the respective first and second regions. Prior to forming the fin structures, a p-type well can be formed in the first region; and an n-type well can be formed in the second region. Next, a first fin structure including alternating first and second semiconductor layers in p-type can be formed from the p-type well; and a second fin structure including alternating first and second semiconductor layers in n-type can be formed from the n-type well. By performing the rest of operations of the method 100 with certain operations respectively performed in the first and second regions, the n-type GAA transistors and p-type GAA transistors can be formed in the first and second regions, respectively. For example, when forming the dummy fin structures for the n-type and p-type GAA transistors (e.g., operation 114 of FIG. 1), the corresponding operations may be performed in the first and second regions, respectively. In another example, when forming the source/drain structures for the n-type and p-type GAA transistors (e.g., operation 120 of FIG. 1), the corresponding operations may be performed in the first and second regions, respectively. In yet another example, when deforming the dummy fin structures for the n-type and p-type GAA transistors (e.g., operation 128 of FIG. 1), the corresponding operations may be performed in the first and second regions, respectively.

In one aspect of the present disclosure, a semiconductor device is disclosed. The semiconductor device includes a first active fin structure and a second active fin structure extending along a first lateral direction. The semiconductor device includes a dummy fin structure, extending also along the first lateral direction, that is disposed between the first active fin structure and the second fin structure. The dummy fin structure includes a material that is configured to induce mechanical deformation of a first source/drain structure coupled to an end of the first active fin structure and a second source/drain structure coupled to an end of the second active fin structure.

In another aspect of the present disclosure, a semiconductor device is disclosed. The semiconductor device includes a first transistor configured in a first conduction type. The first transistor includes a first active fin structure, and a first source/drain structure coupled to an end of the first active fin structure. The semiconductor device includes a second transistor configured in a second conduction type different from the first conduction type. The second transistor includes a second active fin structure, and a second source/drain structure coupled to an end of the second active fin structure. The semiconductor device includes a first dummy fin structure disposed next to the first transistor, and a second dummy fin structure disposed next to the second transistor. The first dummy fin structure includes a first material that is configured to cause a first type of deformation of the first source/drain structure. The second dummy fin structure includes a dielectric material, different from the first material, that is configured to cause a second type of deformation of the second source/drain structure.

In yet another aspect of the present disclosure, a method for fabricating a semiconductor device is disclosed. The method includes forming a plurality of fin structures extending along a first lateral direction. The method includes forming a dummy fin structure disposed between two adjacent ones of the plurality of fin structures. The dummy fin structure also extends along the first lateral direction and includes a deformable material. The method includes recessing respective end portions of each the plurality of fin structures. The method includes forming source/drain structures coupled to respective ends of each of the two adjacent fin structures. The method includes deforming the deformable material of the dummy fin structure to apply either a tensile stress or a compressive stress on the source/drain structures coupled to each of the two adjacent fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a first active channel structure and a second active channel structure extending along a first lateral direction;

an active gate structure extending along a second lateral direction perpendicular to the first lateral direction; and a dummy fin structure, also extending along the first lateral direction, that is disposed between the first active channel structure and the second active channel structure, wherein the first active channel structure, the dummy fin structure, and the second active channel structure are overlaid by the active gate structure;

wherein the dummy fin structure includes a material that is configured to induce mechanical deformation on a first source/drain structure coupled to an end of the first active channel structure and on a second source/drain structure coupled to an end of the second active channel structure.

2. The semiconductor device of claim 1, wherein the material includes a deformed silicon nitride.

3. The semiconductor device of claim 2, wherein the deformed silicon nitride is configured to apply a tensile stress to the first and second source/drain structures.

4. The semiconductor device of claim 2, wherein each of the first and second source/drain structures includes n-type dopants.

5. The semiconductor device of claim 1, wherein the material includes a deformed silicon germanium.

6. The semiconductor device of claim 5, wherein the deformed silicon germanium is configured to apply a compressive stress to the first and second source/drain structures.

7. The semiconductor device of claim 5, wherein each of the first and second source/drain structures includes p-type dopants.

8. The semiconductor device of claim 1, wherein the first active channel structure includes a plurality of first semiconductor layers vertically separated from one another, and the second active channel structure includes a plurality of second semiconductor layers vertically separated from one another.

9. The semiconductor device of claim 8, wherein the active gate structure includes a first portion wrapping around each of the plurality of first semiconductor layers, and a second portion wrapping around each of the plurality of second semiconductor layers.

10. The semiconductor device of claim 1, further comprising a high-k dielectric material deposited over a top surface of the dummy fin structure.

11. A semiconductor device, comprising:

a first transistor configured in a first conduction type, comprising:
- a first active channel structure;
- a first active gate structure over the first active channel structure; and
- a first source/drain structure coupled to an end of the first active channel structure;

a second transistor configured in a second conduction type different from the first conduction type, comprising:
- a second active channel structure;
- a second active gate structure over the second active channel structure; and
- a second source/drain structure coupled to an end of the second active channel structure;

a first dummy fin structure disposed next to the first active channel structure and the first source/drain structure, and is overlaid by the first active gate structure; and a second dummy fin structure disposed next to the second active channel structure and the second source/drain structure, and is overlaid by the second active gate structure;

wherein the first dummy fin structure includes a first material that is configured to cause a first type of deformation of the first source/drain structure, and the second dummy fin structure includes a dielectric material, different from the first material, that is configured to cause a second type of deformation of the second source/drain structure.

12. The semiconductor device of claim 11, wherein the first material includes a deformed silicon nitride configured to apply a tensile stress to the first source/drain structure.

13. The semiconductor device of claim 12, wherein the first source/drain structure includes n-type dopants.

14. The semiconductor device of claim 11, wherein the dielectric material includes a deformed germanium oxide configured to apply a compressive stress to the second source/drain structure.

15. The semiconductor device of claim 14, wherein the second source/drain structure includes p-type dopants.

16. The semiconductor device of claim 11, wherein each of the first and second active channel structures includes a plurality of semiconductor layers vertically separated from one another.

17. A semiconductor device, comprising:

an active channel structure extending along a first lateral direction;

an active gate structure extending along a second lateral direction and disposed over the active channel structure; and a dummy fin structure, extending along the first lateral direction, that is disposed immediately next to the active channel structure and overlaid by the active gate structure;

wherein the dummy fin structure includes a material that is configured to induce mechanical deformation on a source/drain structure coupled to an end of the active channel structure.

18. The semiconductor device of claim 17, wherein the active channel structure includes a plurality of semiconductor layers vertically separated from one another, and wherein each of the plurality of semiconductor layers is wrapped by the active gate structure.

19. The semiconductor device of claim 17, wherein the material includes a deformed silicon nitride configured to apply a tensile stress to the source/drain structure.

20. The semiconductor device of claim 17, wherein the material includes a deformed silicon germanium configured to apply a compressive stress to the source/drain structure.

* * * * *